US006995436B2

(12) United States Patent
Kawasaki

(10) Patent No.: US 6,995,436 B2
(45) Date of Patent: Feb. 7, 2006

(54) NONVOLATILE SEMICONDUCTOR MEMORY DEVICE

(75) Inventor: Toshiaki Kawasaki, Takatsuki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 15 days.

(21) Appl. No.: 10/860,112

(22) Filed: Jun. 4, 2004

(65) Prior Publication Data

US 2004/0245567 A1 Dec. 9, 2004

(30) Foreign Application Priority Data

Jun. 4, 2003 (JP) ............................ 2003-158735

(51) Int. Cl.
*H01L 29/76* (2006.01)

(52) U.S. Cl. ...................... 257/390; 257/202; 257/204; 257/206; 257/315; 257/316; 257/909; 257/E27.078

(58) Field of Classification Search ..................... None
See application file for complete search history.

(56) References Cited

U.S. PATENT DOCUMENTS 6,204,541 B1 * 3/2001 Togami et al. ............. 257/390

OTHER PUBLICATIONS

McPartland, Richard J., et al., "1.25 Volt, Low Cost, Embedded FLASH Memory for Low Density Applications", 2000 Symposium on VLSI Circuits Digest of Technical Papers, pp. 158-161.

* cited by examiner

*Primary Examiner*—Andy Huynh
(74) *Attorney, Agent, or Firm*—Steptoe & Johnson LLP

(57) ABSTRACT

In a memory cell, the substrate contact region of an NMOS transistor and the well contact region of a PMOS transistor are arranged perpendicularly to a floating gate. In a cell array, the memory cell and another memory cell arranged axisymmetrically with respect to the memory cell are alternately arranged in the column direction to constitute a sub array, and the sub arrays arranged in the column direction are arranged in parallel or axisymmetically in the row direction. With this arrangement, the substrate contact region, the well contact region, and the diffusion region of the PMOS transistor can be shared between the adjacent memory cells, thereby reducing the area of the cell array.

25 Claims, 19 Drawing Sheets

X (COLUMN DIRECTION)
Y (ROW DIRECTION)
56 1 7 2 55 51A 56 50 CELL ARRAY 55
51
51C 51C

X (COLUMN DIRECTION)
Y (ROW DIRECTION)
55
56
50
51C
2
7
1
51
53a

X (COLUMN DIRECTION)
Y (ROW DIRECTION)
70
71A
71C
71C
2
75
1
76
7
71
71

X (COLUMN DIRECTION)
Y (ROW DIRECTION)
70
71A
71C
71C
75
76
1
2
7
71
77

128
121A
120
X (COLUMN DIRECTION)
127
20
22
126
28
21
128
121
121C
Y (ROW DIRECTION)

X (COLUMN DIRECTION)
Y (ROW DIRECTION)
128
121A
120
127
120
22
126
28
21
128
121
121C 141A
140
X (COLUMN DIRECTION)
20
147
22
146
21
148
28
141
141C
Y (ROW DIRECTION)

X (COLUMN DIRECTION)
Y (ROW DIRECTION)
141A
140
20
147
22
146
21
148
28
141
141B
141C 161A
160
X (COLUMN DIRECTION)
21
168
20
167
22
166
28
161
161B
Y (ROW DIRECTION)
161C

X (COLUMN DIRECTION)
Y (ROW DIRECTION)
186
180
21
188
20
187
22
186
281
181
189

X (COLUMN DIRECTION)
Y (ROW DIRECTION)
190
191A
191C
191C
196
22
20
197
28
191
21
198

NONVOLATILE SEMICONDUCTOR MEMORY DEVICE

BACKGROUND OF THE INVENTION

1. Field of the Invention

The present invention relates to a semiconductor memory device and particularly to a layout method of a nonvolatile semiconductor memory device manufactured in a CMOS process.

2. Description of the Related Art

Nonvolatile semiconductor memories are used in various systems. The combination of the nonvolatile memory and a logic LSI on the same semiconductor substrate can achieve lower process cost and miniaturization. However, a method of forming and combining a nonvolatile memory and a logic LSI on different chips or a method of changing a standard CMOS process to combine a nonvolatile memory and a logic LSI on the same chip are conventionally used due to a difference in manufacturing process, resulting in high process cost and complexity.

As a solution of this problem, a nonvolatile memory is known which is readily manufactured by a CMOS process, forms a floating gate by using the gates of an NMOS transistor and a PMOS transistor, and uses the diffusion region of the PMOS transistor as a control gate. See Japanese Unexamined Patent Publication No. 6-334190 and Japanese Unexamined Patent Publication No. 6-53521, for example.

Further, a nonvolatile memory is available in which a first PMOS diffusion region is used as a control gate for writing and reading and a second PMOS diffusion region is used for erasing. See Richard J. McPartland and Ranbir Singh, "1.25 Volt, Low Cost, Embedded FLASH Memory for Low Density Applications" 2000 Symposium on VLSI Circuits Digest of Technical Papers 1 2.2, for example.

Regarding nonvolatile semiconductor memories manufactured by a CMOS process, the above documents disclose a cell structure and a circuit technique for incorporating the structure as an array but do not disclose any layout method for reducing the area of a cell array in the array arrangement of memory cells.

Such nonvolatile semiconductor memories are currently used in small capacity systems. A future capacity increase will make an area of a cell array an important factor in consideration of cost.

The present invention relates to a nonvolatile memory manufactured by a CMOS process and particularly proposes a nonvolatile semiconductor memory device with a layout method for reducing the area of a cell array in the array arrangement of a memory cell composed of a single NMOS transistor and a single PMOS transistor and a memory cell which has two different control gates and is composed of a single NMOS transistor and two PMOS transistors.

DISCLOSURE OF THE INVENTION

A nonvolatile semiconductor memory device of the present invention comprises a first MOS transistor which is formed on the semiconductor substrate of a first conductivity type and has a current-carrying region of a second conductivity type and a gate electrode, a second MOS transistor which has a well of a second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, the memory device comprising a cell array in which memory cells are arranged in the row direction and the column direction, the memory cell being capable of writing, reading, and erasing a carrier on the floating gate by applying a predetermined voltage to each terminal of the first MOS transistor and the second MOS transistor, wherein the cell array has a well contact region arranged perpendicularly to the longitudinal direction of the floating gate, the well contact region being provided for applying a potential to the semiconductor substrate and the well of the second MOS transistor.

Further, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, the memory device comprising a cell array in which memory cells are arranged in the row direction and the column direction, the memory cell being capable of writing, reading, and erasing a carrier on the floating gate by applying a predetermined voltage to each terminal of the first MOS transistor and the second MOS transistor, wherein the cell array has a well contact region arranged in parallel with the longitudinal direction of the floating gate, the well contact region being provided for applying a potential to the substrate of the first MOS transistor and the well of the second MOS transistor.

Moreover, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, the memory device comprising a cell array in which memory cells are arranged in the row direction (Y) and the column direction (X), the memory cell being capable of writing, reading, and erasing a carrier on the floating gate by applying a predetermined voltage to each terminal of the first MOS transistor and the second MOS transistor, wherein the cell array has a substrate contact region, which applies a potential to the substrate of the first MOS transistor, in parallel with the longitudinal direction of the floating gate, and the cell array has a well contact region, which applies a potential to the well of the second MOS transistor, perpendicularly to the longitudinal direction of the floating gate.

Furthermore, a nonvolatile semiconductor memory device of the present invention comprises a first MOS transistor which is formed on a semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, the memory device comprising a cell array in which memory cells are arranged in the row direction and the column direction, the memory cell being capable of writing, reading, and erasing a carrier on the floating gate by applying a predetermined voltage to each terminal of the first MOS transistor and the second MOS transistor, wherein the memory cell has a substrate contact region, which applies a potential to the substrate of the first MOS transistor, perpendicularly to the longitudinal direction of the floating gate, and the cell array has a well contact region, which applies a potential to the well of the second MOS transistor, in parallel with the longitudinal direction of the floating gate.

In the cell array, the memory cells are arranged in parallel or axisymmetrically in the column direction (X) to constitute a sub array and the sub arrays arranged in the column direction (X) are arranged in parallel or axisymmetrically in the row direction (Y).

In the cell array, the memory cell and another memory cell arranged axisymmetrically with respect to the memory cell constitute a sub array in the column direction (X) and the sub arrays arranged in the column direction are arranged in parallel or axisymmetrically in the row direction (Y).

On a boundary of the memory cell and the sub array, overlapping contact regions and/or diffusion regions are shared between the adjacent memory cells and sub arrays.

The cell array comprises a memory cell which has the substrate contact region for applying a potential to the substrate of the first MOS transistor and the well contact region for applying a potential to the well of the second MOS transistor and a memory cell which does not have the substrate contact region for applying a potential to the substrate of the first MOS transistor or the well contact region for applying a potential to the well of the second MOS transistor, and the substrate contact region and the well contact region are disposed for a plurality of memory cells.

The cell array comprises a memory cell which has the substrate contact region for applying a potential to the substrate of the first MOS transistor and the well contact region for applying a potential to the well of the second MOS transistor and a memory cell which has the substrate contact region for applying a potential to the substrate of the first MOS transistor but does not have the well contact region for applying a potential to the well of the second MOS transistor, and the well contact region for applying a potential to the well of the second MOS transistor is disposed for a plurality of memory cells.

The cell array comprises a memory cell which has the substrate contact region for applying a potential to the substrate of the first MOS transistor and the well contact region for applying a potential to the well of the second MOS transistor and a memory cell which has the well contact region for applying a potential to the well of the second MOS transistor but does not have the substrate contact region for applying a potential to the substrate of the first MOS transistor, and the substrate contact region for applying a potential to the substrate of the first MOS transistor is disposed for a plurality of memory cells.

Further, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, the memory device comprising a cell array in which memory cells are arranged in an array on the semiconductor substrate, the memory cell being capable of writing, reading, and erasing a carrier on the floating gate by applying a predetermined voltage to each terminal of the first, second, and third MOS transistors, wherein the cell array has a substrate contact region, which applies a potential to the substrate of the first MOS transistor, in parallel with the longitudinal direction of the floating gate, and the cell array has contact regions, which apply a potential to the wells of the second and third MOS transistors, perpendicularly to the longitudinal direction of the floating gate.

Moreover, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, the memory device comprising a cell array in which memory cells are arranged in an array on the semiconductor substrate, the memory cell being capable of writing, reading, and erasing a carrier on the floating gate by applying a predetermined voltage to each terminal of the first, second, and third MOS transistors, wherein the cell array has a substrate contact region, which applies a potential to the substrate of the first MOS transistor, and well contact regions, which apply a potential to the wells of the second and third MOS transistors, in parallel with the longitudinal direction of the floating gate.

Furthermore, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, the memory device comprising a cell array in which memory cells are arranged in an array on the semiconductor substrate, the memory cell being capable of writing, reading, and erasing a carrier on the floating gate by applying a predetermined voltage to each terminal of the first, second, and third MOS transistors, wherein the cell array has a substrate contact region, which applies a potential to the substrate of the first MOS transistor, and well contact regions, which apply a potential to the wells of the second and third MOS transistors, perpendicularly to the longitudinal direction of the floating gate.

Moreover, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, the memory device comprising a cell array in which memory cells are arranged in an array on the semiconductor substrate, the memory cell being capable of writing, reading, and erasing a carrier on the floating gate by applying a predetermined voltage to each terminal of the first, second, and third MOS transistors, wherein the cell array has a substrate contact region, which applies a potential to the substrate of the first MOS transistor, perpendicularly to the longitudinal direction of the floating gate, and the cell array has well contact regions, which apply a potential to the wells of the second and third MOS transistors, in parallel with the longitudinal direction of the floating gate.

In the arrangement of the MOS transistors constituting the memory cell, the second MOS transistor and the third transistor are disposed respectively on the sides of the first MOS transistor which is disposed at the center of the arrangement.

In the arrangement of the MOS transistors constituting the memory cell, the second MOS transistor is adjacent to the first MOS transistor and the third MOS transistor is adjacent to the second MOS transistor.

In the cell array, the memory cells are arranged in parallel with the column direction (X) to constitute a sub array, and the sub arrays arranged in the column direction (X) are arranged in parallel or axisymmetrically in the row direction (Y).

In the cell array, the memory cell and another memory cell which is arranged point symmetrically with respect to the memory cell constitute a sub array in the column direction (X), and the sub arrays arranged in the column direction (X) are arranged in parallel or axisymmetrically in the row direction (Y).

On a boundary of the memory cells, overlapping contact regions and diffusion regions are shared between the adjacent memory cells.

The cell array comprises a memory cell which has the substrate contact region for applying a potential to the substrate of the first MOS transistor and the well contact regions for applying a potential to the wells of the second and third MOS transistors and a memory cell which does not have the substrate contact region for applying a potential to the substrate of the first MOS transistor or the well contact regions for applying a potential to the wells of the second and third MOS transistors, and the contact regions for applying a potential to the substrate of the first MOS transistor and the wells of the second and third MOS transistors are disposed for a plurality of memory cells.

The cell array comprises a memory cell which has the substrate contact region for applying a potential to the substrate of the first MOS transistor and the well contact regions for applying a potential to the wells of the second and third MOS transistors and a memory cell which has the substrate contact region for applying a potential to the substrate of the first MOS transistor but does not have the well contact regions for applying a potential to the wells of the second and third MOS transistors, and the well contact regions for applying a potential to the wells of the second and third MOS transistors are disposed for a plurality of memory cells.

Further, a nonvolatile semiconductor memory device of the present invention comprises a first MOS transistor which is formed on the semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, the memory device comprising a cell array in which memory cells are arranged in an array on the semiconductor substrate, the memory cell being capable of writing, reading, and erasing a carrier on the floating gate by applying a predetermined voltage to each terminal of the first, second, and third MOS transistors, wherein in the cell array, the second MOS transistor and the third MOS transistor are arranged in one of the column direction (X) and the row direction (Y), the first NMOS transistor is adjacent to one of the second MOS transistor and the third MOS transistor in the other of the column direction (X) and the row direction (Y), the gate electrode of the second MOS transistor and the gate electrode of the third MOS transistor are connected to each other via the floating gate, the floating gate is extended and connected to the gate electrode of the first MOS transistor from the vicinity of the one of the second MOS transistor and the third MOS transistor, and the contact region for applying a potential to the substrate of the first MOS transistor is arranged so as to be adjacent to the first MOS transistor on the other of the second MOS transistor and the third MOS transistor.

DESCRIPTION OF THE EMBODIMENTS

Referring to FIGS. 1 to 21, embodiments of the present invention will be described below.

Embodiment 1

Figure 1:
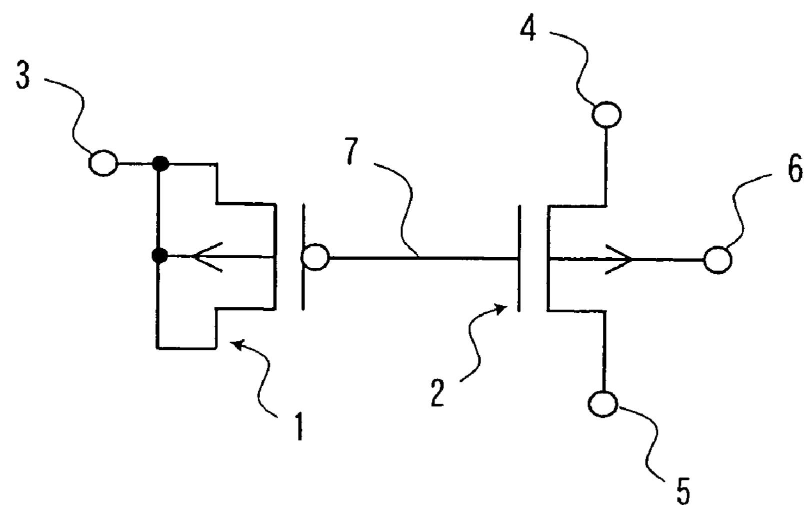
FIG. 1 is a circuit diagram showing a memory cell comprising a single NMOS transistor and a single PMOS transistor.
Figure 2:
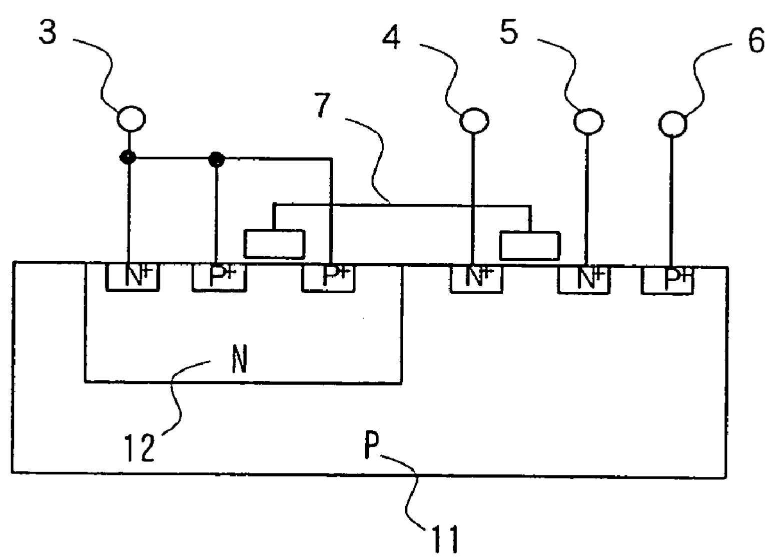
FIG. 2 is a process sectional view showing the memory cell of FIG. 1.

FIG. 1 is a circuit diagram showing a memory cell comprising a single NMOS transistor and a single PMOS transistor. FIG. 2 shows an example of a process sectional view showing the memory cell of FIG. 1.

In FIG. 1, reference numeral 1 denotes a PMOS transistor, reference numeral 2 denotes an NMOS transistor, reference numeral 3 denotes a control gate, reference numeral 4 denotes the drain of the NMOS transistor 2, reference numeral 5 denotes the source of the NMOS transistor 2, reference numeral 6 denotes the substrate of the NMOS transistor 2, reference numeral 7 denotes a floating gate connected to the gates of the PMOS transistor 1 and the NMOS transistor 2.

As shown in FIG. 2, the NMOS transistor 2 serving as a MOS transistor of a second conductivity type is formed on a P-type semiconductor substrate 11 of a first conductivity type, and the NMOS transistor 2 has an N-type current-carrying region of a second conductivity type and a gate electrode. The PMOS transistor 1 serving as a MOS transistor of a first conductivity type has a well 12 of a second conductivity type that is provided on the semiconductor substrate 11 and acts as a control gate, and the PMOS transistor 1 has a current-carrying region of a first conductivity type and a gate electrode that are provided on the well 12.

Figure 5:
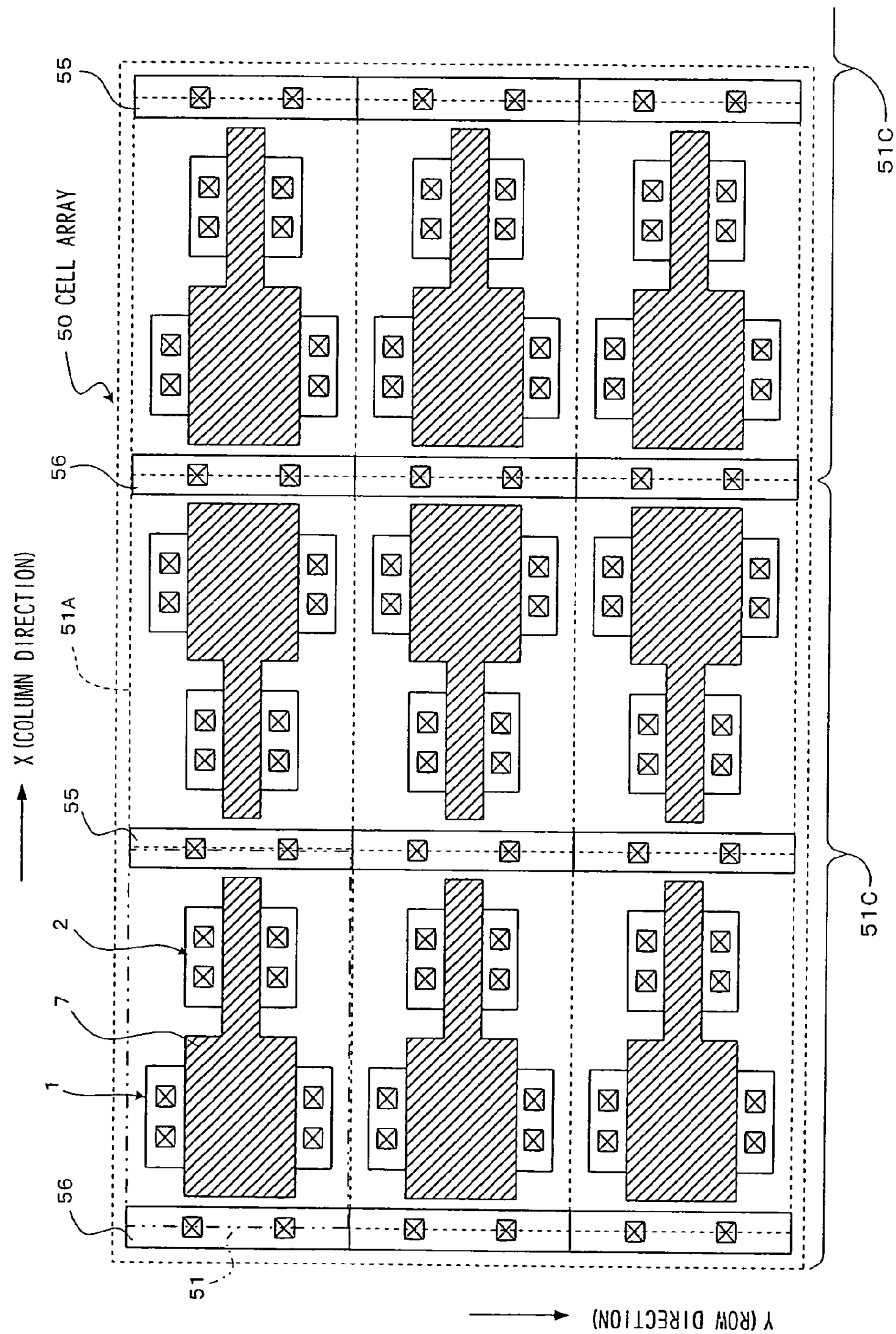
FIG. 5 is a cell array layout diagram showing (Embodiment 1) of the present invention.

As shown in FIG. 5, memory cells 51 are arranged in the row direction and column direction to constitute a cell array 50. In the memory cell 51, the gate electrode of the NMOS transistor 2 and the gate electrode of the PMOS transistor 1 are connected via the floating gate 7 and a predetermined voltage is applied to each terminal, so that a carrier can be written, read, and erased on the floating gate 7.

Prior to the explanation on the arrangement of the cell array 50 shown in FIG. 5, the reference drawing of FIG. 6 will be discussed below.

Figure 6:
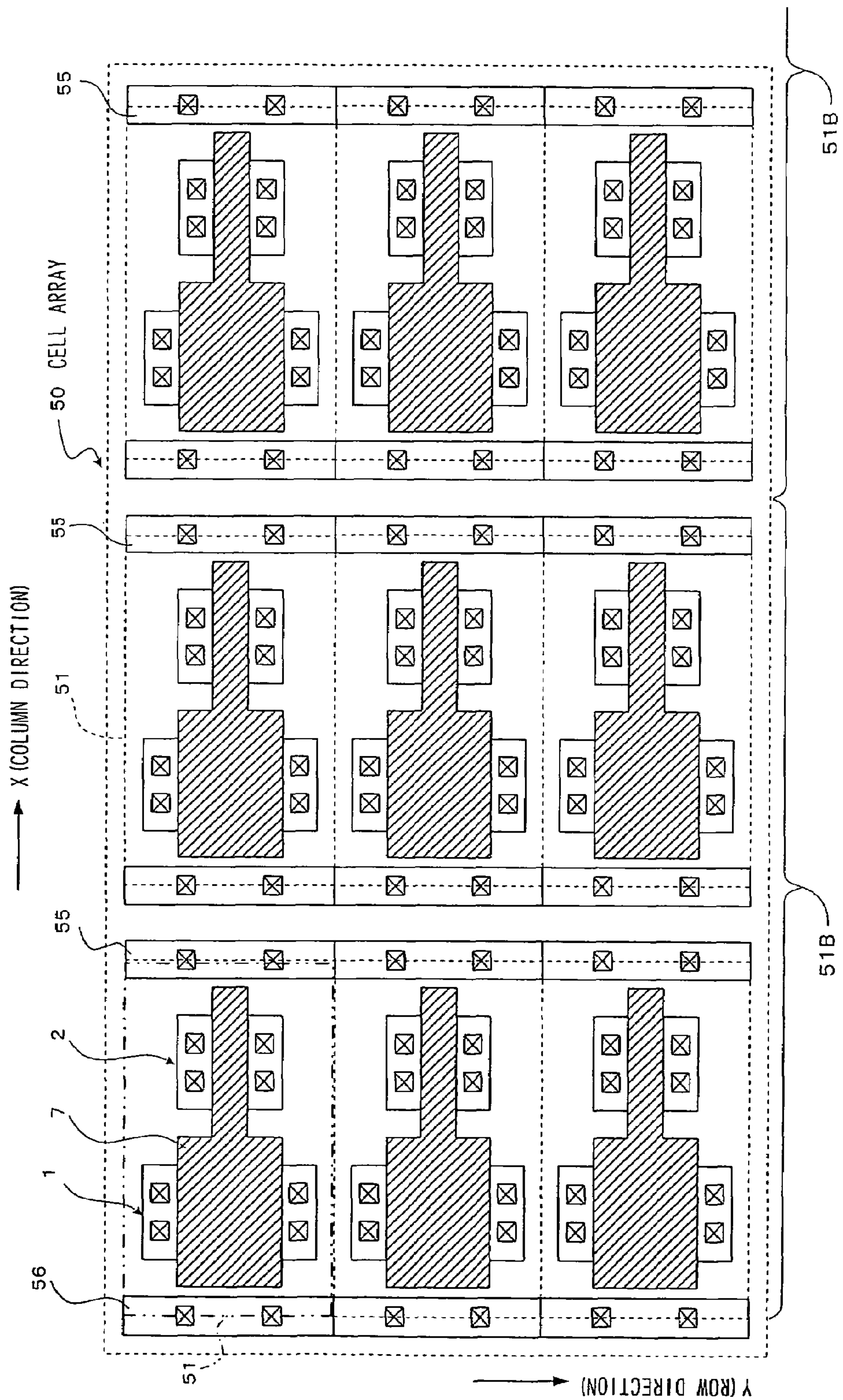
FIG. 6 is an explanatory diagram of FIG. 5.

FIG. 6 shows a layout of a nonvolatile semiconductor memory device shown in FIGS. 1 and 2.

Reference numeral 50 denotes a cell array and reference numeral 51 denotes a memory cell. Reference numeral 55 denotes a substrate contact region for applying the substrate potential of the NMOS transistor 2 and reference numeral 56 denotes a well contact region for applying the well potential of the PMOS transistor 1.

The memory cell 51 is composed of the NMOS transistor 2 and the PMOS transistor 1 which are adjacent to each other and are connected via the floating gate 7. The cell array 50 comprises a number of memory cells 51 arranged in the column direction (X) and the row direction (Y). The well contact region 56 is electrically connected to the source and drain of the PMOS transistor 1 via a wiring layer and acts as a control gate.

In the memory cell 51, the substrate contact region 55 of the NMOS transistor 2 and the well contact region 56 of the PMOS transistor 1 are arranged perpendicularly to the longitudinal direction of the floating gate 7.

In the case of the cell array 50 shown in FIG. 6, the memory cells 51 are arranged in parallel with the column direction (X) to constitute a sub array 51B. In the row direction (Y), the sub arrays 51B arranged in the column direction (X) are arranged in parallel or axisymmetrically.

When the memory cells 51 are arranged in parallel with the column direction (X), it is necessary to secure separation of the substrate contact region 55 and the well contact region 56 between the adjacent memory cells.

As shown in (Embodiment 1) of FIG. 5, the memory cell 51 and a memory cell 51A, which is axisymmetrically arranged with respect to the memory cell 51, are alternately arranged in the column direction (X) to constitute a sub array 51C, and the sub arrays arranged in the column direction (X) are arranged in parallel or axisymmetrically in the row direction (Y). In such an array configuration, the substrate contact region 55 and the well contact region 56 can be shared on a boundary of the adjacent memory cells and sub arrays and thus the layout region can be reduced in the column direction (X), thereby reducing the area of the cell array 50.

Figure 7:
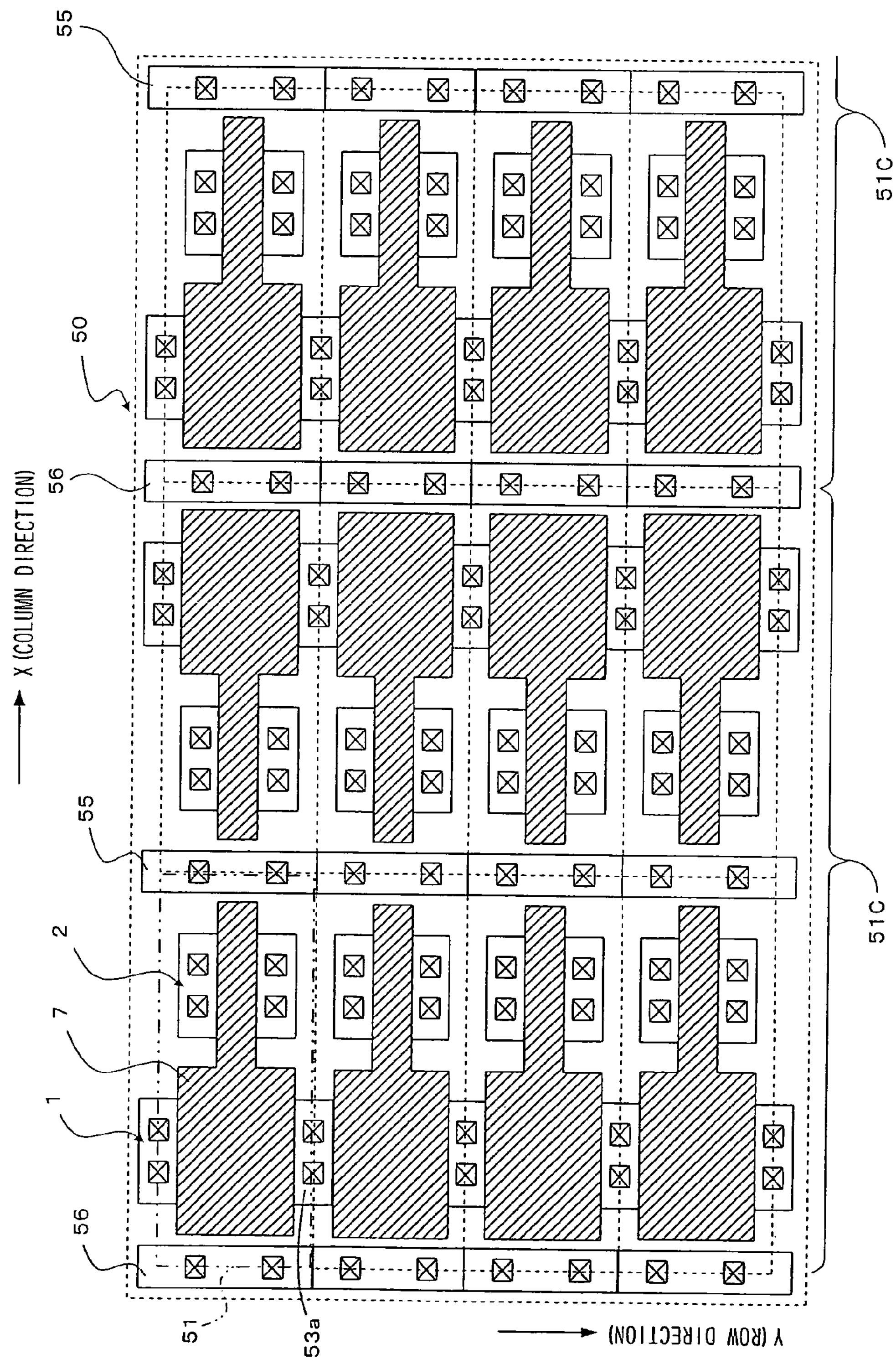
FIG. 7 is a cell array layout diagram showing a variation of (Embodiment 1) of the present invention.

Further, the source and drain of the PMOS transistor 1 are connected to a well potential and act as a control gate. Thus, as shown in FIG. 7, the source and the drain between the memory cells, which are adjacent to each other in the row direction (Y), can be shared as indicated by 53*a*. This arrangement can reduce the layout in the row direction (Y) in addition to the column direction (X), thereby further reducing the area of the cell array 50.

Embodiment 2

Figure 8:
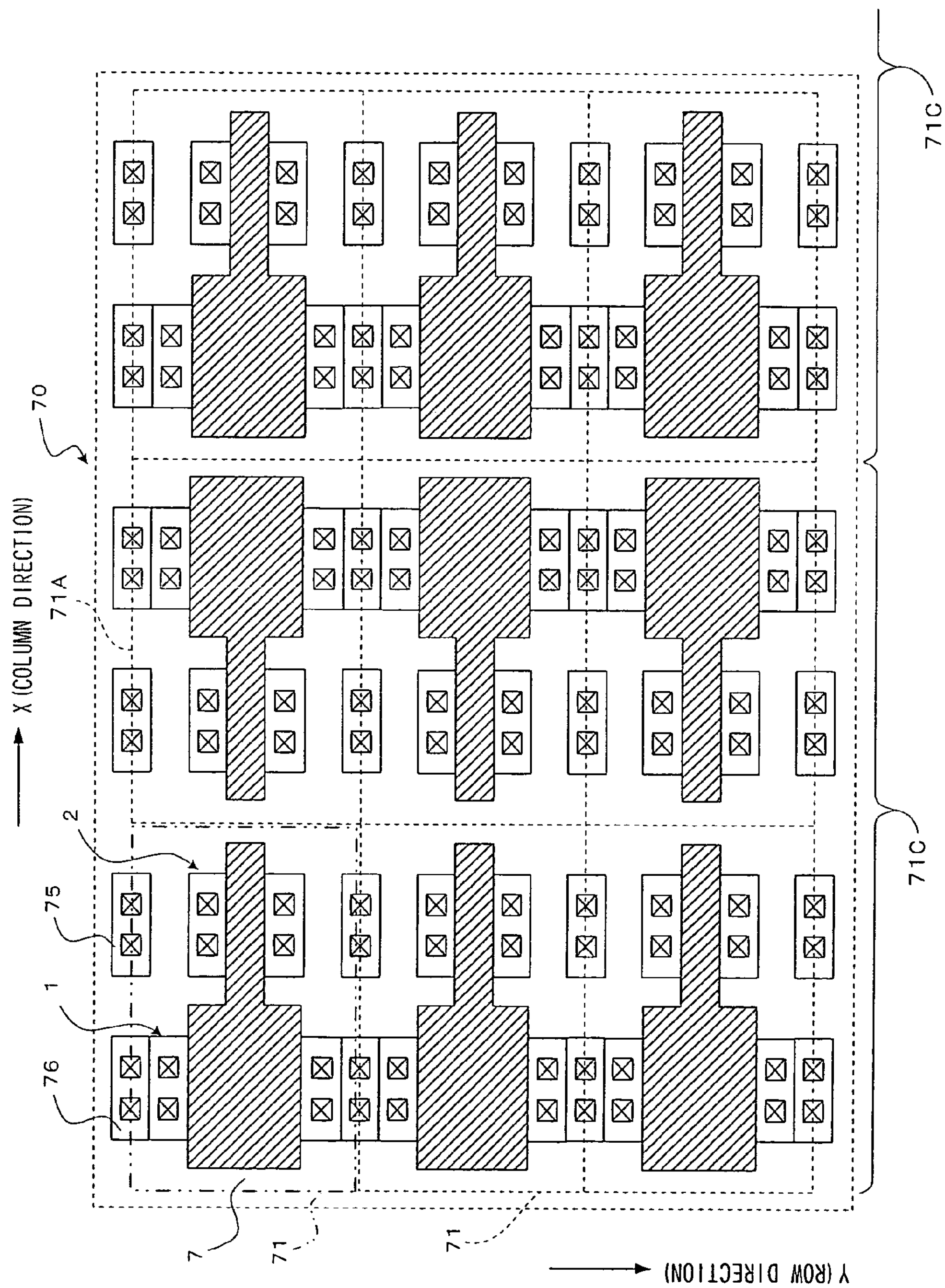
FIG. 8 is a cell array layout diagram showing (Embodiment 2) of the present invention.

FIG. 8 shows (Embodiment 2) of the present invention.

FIG. 8 shows a layout of the nonvolatile semiconductor memory device shown in FIGS. 1 and 2.

Reference numeral 70 denotes a cell array and reference numerals 71 and 71A denote memory cells. Reference numeral 75 denotes a substrate contact region for applying the substrate potential of an NMOS transistor 2 and reference numeral 76 denotes a well contact region for applying the well potential of a PMOS transistor 1.

The memory cell 71 is composed of the NMOS transistor 2 and the PMOS transistor 1 which are adjacent to each other and are connected to a floating gate 7. The cell array 70 comprises a number of memory cells 71 arranged in the column direction (X) and the row direction (Y). The well contact region 76 is electrically connected to the source and drain of the PMOS transistor 1 via a wiring layer and acts as a control gate.

In the memory cell 71, the substrate contact region 75 of the NMOS transistor 2 and the well contact region 76 of the PMOS transistor 1 are arranged in parallel with the longitudinal direction of the floating gate 7. Further, in the cell array 70, the memory cell 71 and a memory cell 71A, which is axisymmetrically arranged with respect to the memory cell 71, are alternately arranged in the column direction (X) to constitute a sub array 71C, and the sub arrays arranged in the column direction (X) are arranged in parallel or axisymmetrically in the row direction (Y).

With this arrangement, the substrate contact region 75 and the well contact region 76 can be shared between the adjacent memory cells in the row direction (Y) and thus the layout region can be reduced in the row direction (Y), thereby reducing the area of the cell array 70.

Figure 9:
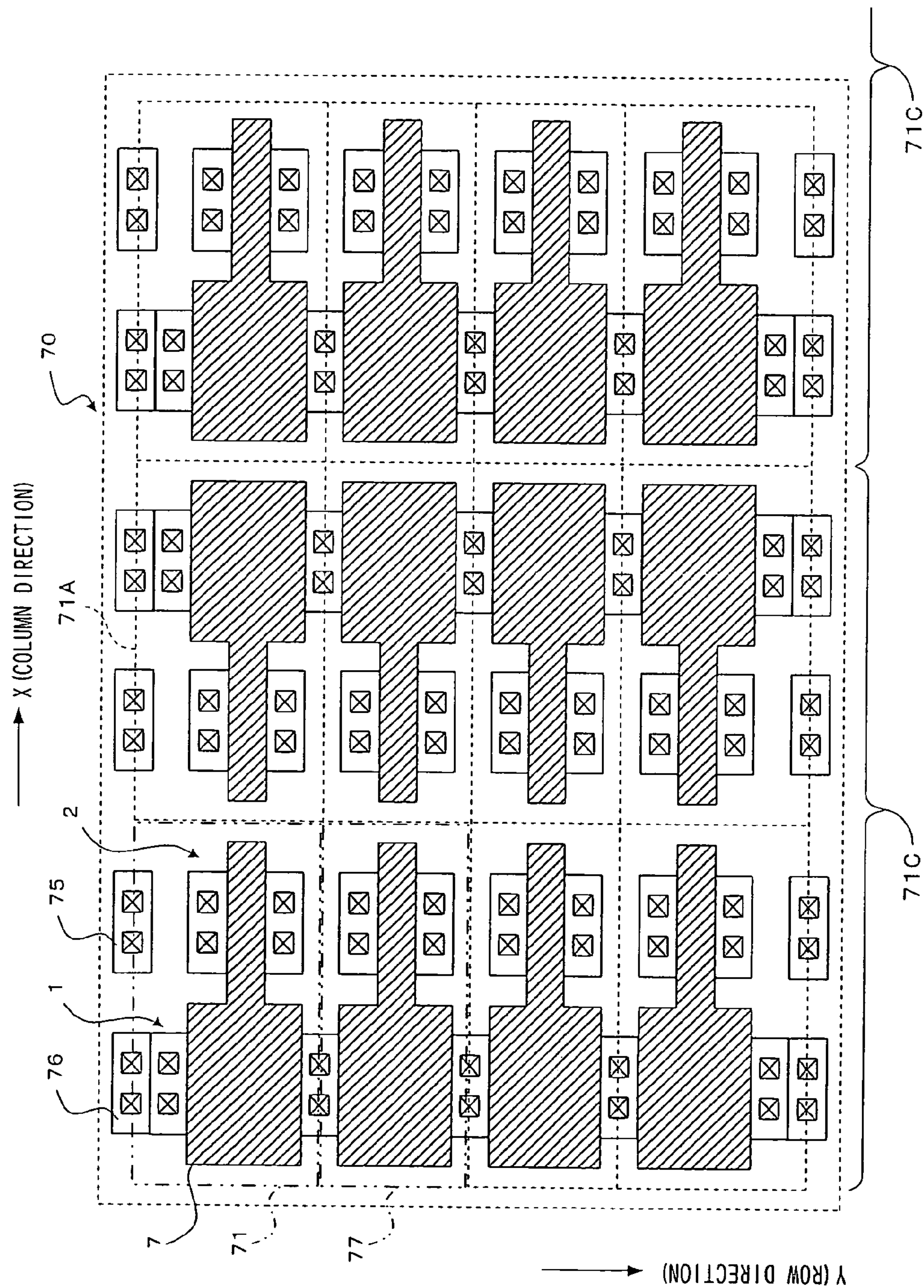
FIG. 9 is a cell array layout diagram showing a variation of (Embodiment 2) of the present invention.

FIG. 9 is a cell array layout drawing showing a variation of (Embodiment 2).

The cell array 70 comprises two kinds of memory cells 71 and 77 arranged as basic units. The memory cell 71 has the substrate contact region 75 and the well contact region 76. The memory cell 77 does not have the substrate contact region 75 or the well contact region 76.

The source and drain of the PMOS transistor 1 are connected to a well potential and act as a control gate. Thus, as shown in FIG. 9, the source and the drain can be shared between the memory cells which are adjacent to each other in the row direction (Y). This arrangement further reduces the layout region in the row direction (Y) and thus the cell array 70 has a smaller area.

According to FIG. 9, the substrate and well contact regions are arranged for a plurality of memory cells. It is recommendable to dispose a contact region in each of the optimum sub arrays according to the size and purpose of the cell array.

In FIGS. 8 and 9, the memory cells 71 are axisymmetrically arranged in the column direction (X) to constitute the sub array 71C and the sub arrays 71C arranged in the column direction (X) are arranged in parallel or axisymmetrically in the row direction (Y). The following arrangement is also applicable: the memory cells 51 are arranged in parallel with the column direction (X) to constitute a sub array and the sub arrays arranged in the column direction (X) are arranged in parallel or axisymmetrically in the row direction (Y).

Embodiment 3

Figure 10:
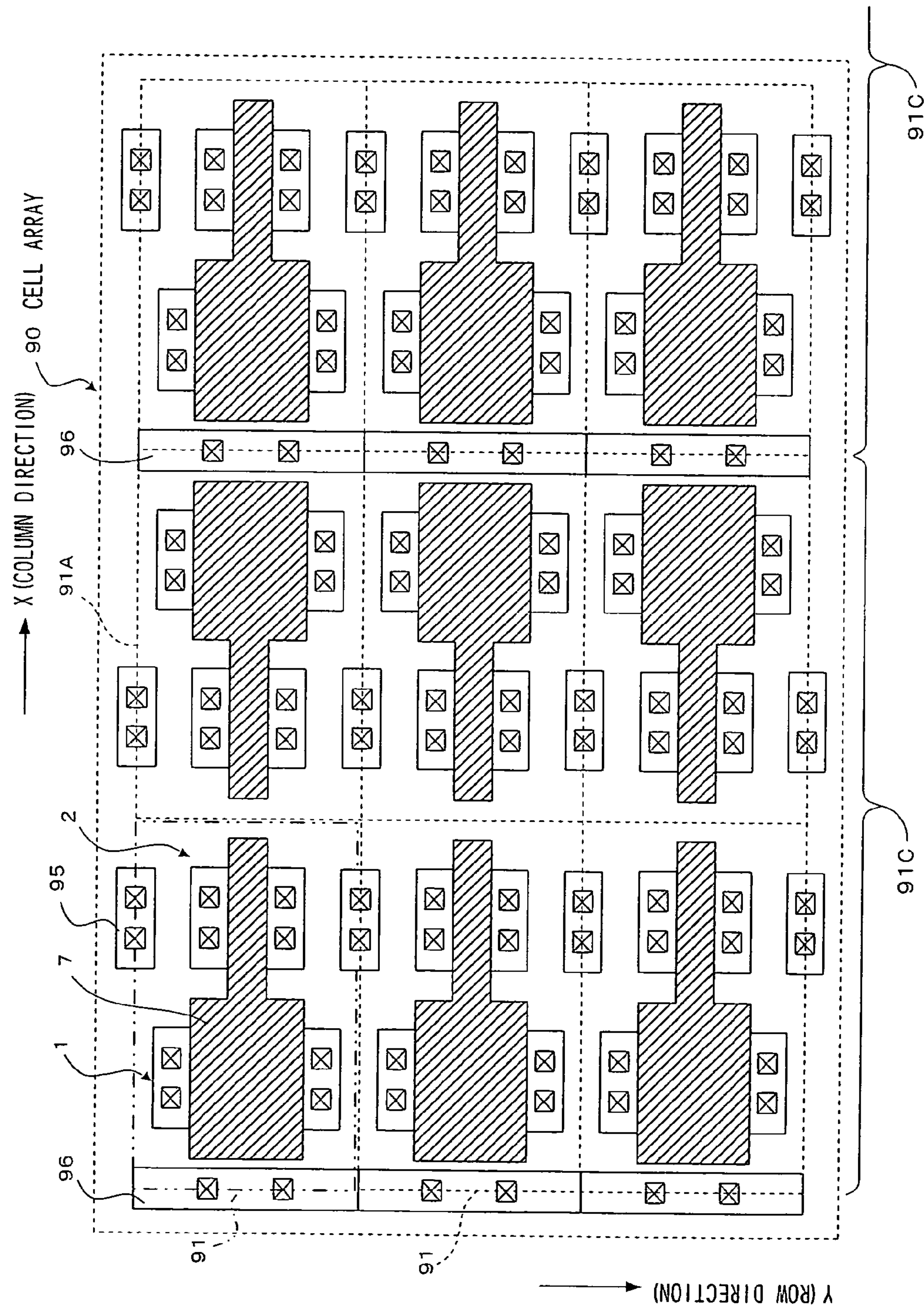
FIG. 10 is a cell array layout diagram showing (Embodiment 3) of the present invention.

FIG. 10 shows (Embodiment 3) of the present invention.

FIG. 10 shows a layout of the nonvolatile semiconductor memory device shown in FIGS. 1 and 2.

Reference numeral 90 denotes a cell array and reference numerals 91 and 91A denote memory cells. Reference numeral 95 denotes a substrate contact region for applying the substrate potential of an NMOS transistor 2, and reference numeral 96 denotes a well contact region for applying the well potential of a PMOS transistor 1.

The memory cell 91 is composed of the NMOS transistor 2 and the PMOS transistor 1 which are adjacent to each other and are connected to a floating gate 7. The cell array 90 comprises a number of sub arrays 91C arranged in the column direction (X) and the row direction (Y).

The well contact region 96 is electrically connected to the source and drain of the PMOS transistor 1 via a wiring layer and acts as a control gate.

In the memory cell 91, the substrate contact region 95 of the NMOS transistor 2 is arranged in parallel with the longitudinal direction of the floating gate 7. The well contact region 96 of the PMOS transistor 1 is arranged perpendicularly to the longitudinal direction of the floating gate 7.

In the cell array 90, the memory cell 91 and a memory cell 91A, which is axisymmetrically arranged with respect to the memory cell 91, are alternately arranged in the column direction (X) to constitute a sub array 91C, and the sub arrays arranged in the column direction (X) are arranged in parallel or axisymmetrically in the row direction (Y).

If the memory cells 91 are arranged in parallel with the column direction (X) and the row direction (Y) to constitute the cell array 90, the well contact region 96 has to be disposed in each of the memory cells 91 in the column direction (X). In contrast, the arrangement of the present invention makes it possible to share the well contact region 96 between the adjacent memory cells in the column direction (X), thereby reducing the area of the cell array.

Figure 11:
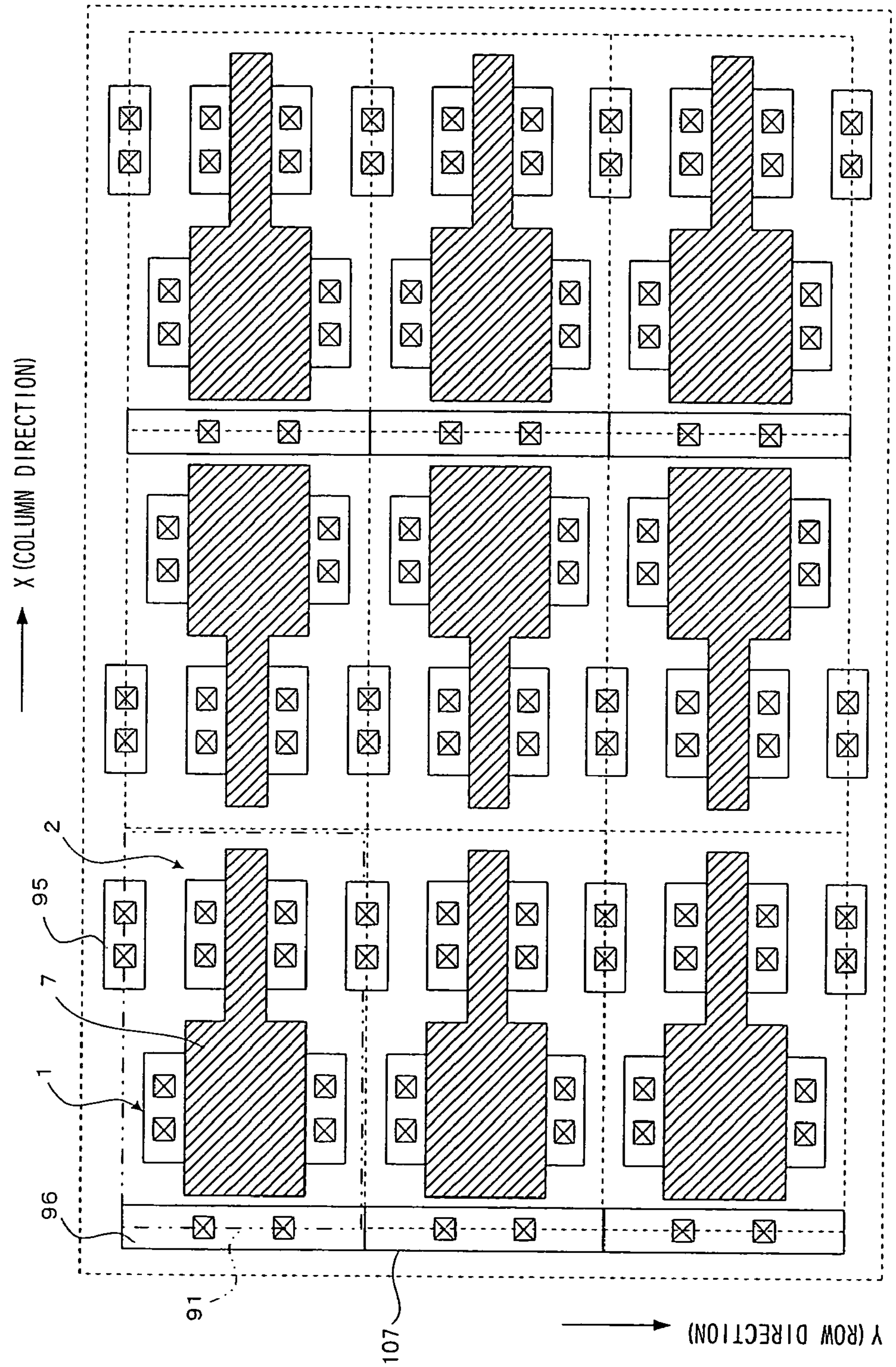
FIG. 11 is a cell array layout diagram showing a variation of (Embodiment 3) of the present invention.

FIG. 11 is a cell array layout drawing showing a variation of (Embodiment 3).

Since the source and drain of the PMOS transistor 1 are connected to a well potential and act as a control gate, as shown in FIG. 11, the source and the drain between the adjacent memory cells can be shared in the row direction (Y). Thus, it is possible to reduce the layout region in the row direction (Y) in addition to the column direction (X), thereby further reducing the area of the cell array.

In the arrangement of FIG. 11, while the well contact region is disposed in each of the memory cells, the substrate contact region is not arranged in each of the memory cells (causing no characteristic problem because at least one well contact region is disposed in every other memory cell). It is recommendable to dispose a contact region in each of the optimum sub arrays according to the size and purpose of the cell array. Reference numeral 97 denotes a cell not having a substrate contact region or a well contact region.

In FIGS. 10 and 11, the memory cells 91 are axisymmetrically arranged in the column direction (X) to constitute the sub array 91C and the sub arrays 91C arranged in the column direction (X) are arranged in parallel or axisymmetrically in the row direction (Y). The following arrangement is also applicable: the memory cells 91 are arranged in parallel with the column direction (X) to constitute a sub array and the sub arrays arranged in the column direction (X) are arranged in parallel or axisymmetrically in the row direction (Y).

Embodiment 4

Figure 12:
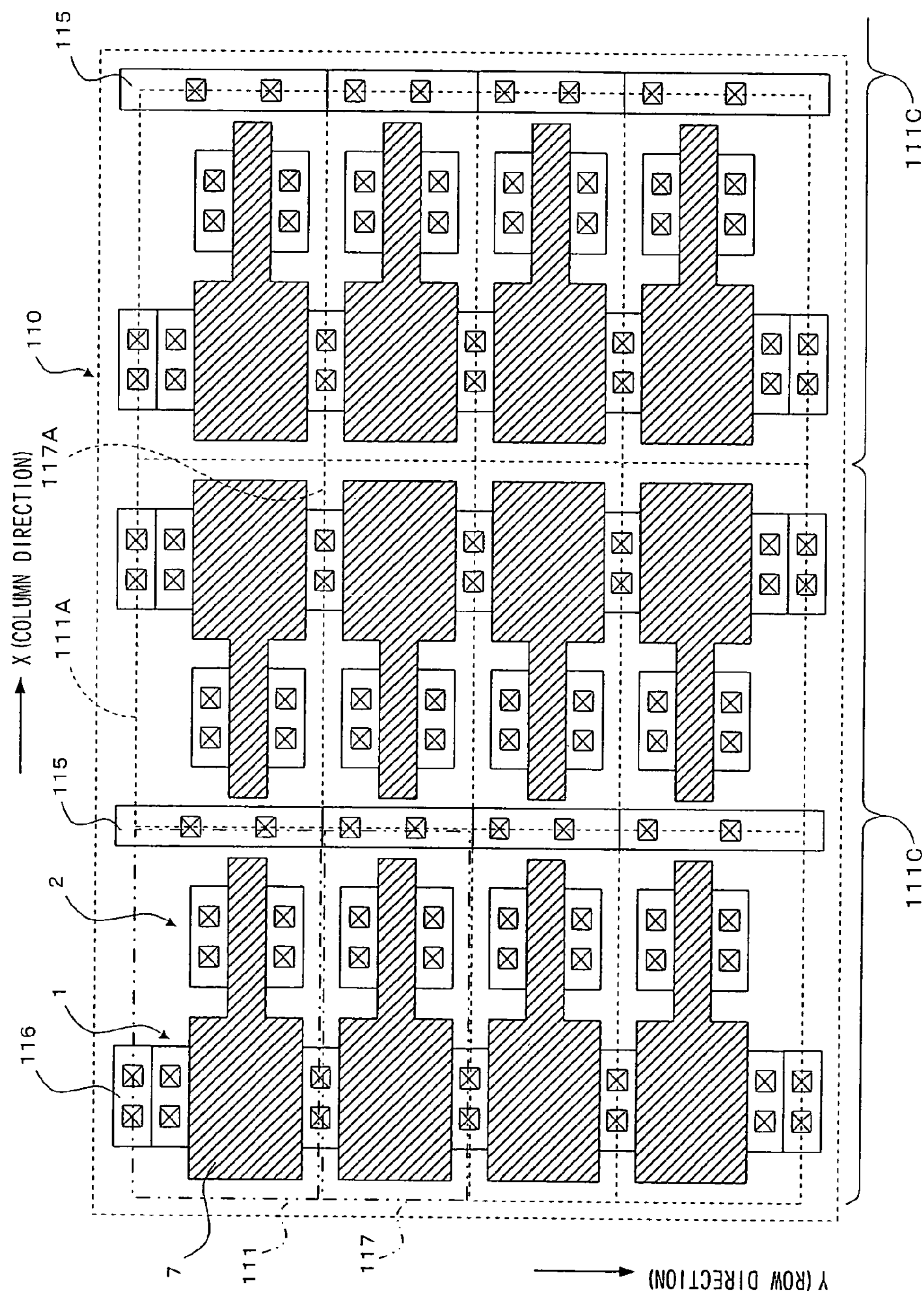
FIG. 12 is a cell array layout diagram showing (Embodiment 4) of the present invention.

FIG. 12 shows (Embodiment 4) of the present invention.

FIG. 12 shows a layout of the nonvolatile semiconductor memory device shown in FIGS. 1 and 2.

Reference numeral 110 denotes a cell array and reference numerals 111 and 117 denote memory cells. Reference numeral 115 denotes a substrate contact region for applying the substrate potential of an NMOS transistor 2, and reference numeral 116 denotes a well contact region for applying the well potential of a PMOS transistor 1.

The memory cells 111 and 117 are each composed of the NMOS transistor 2 and the PMOS transistor 1 which are adjacent to each other and are connected to a floating gate 7.

When the memory cell 11 and the memory cell 117 are compared with each other, while the memory cell 111 has both of the substrate contact region 115 and the well contact region 116, the memory cell 117 has the substrate contact region 115 but does not have the well contact region 116.

The cell array 110 has a column in which the memory cells 111 and memory cells 111A axisymmetrical with respect to the memory cells 111 are alternately arranged in the column direction (X) and a column in which the memory cells 117 and memory cells 117A axisymmetrical with respect to the memory cells 117 are alternately arranged in the column direction (X) These columns are arranged in the row direction (Y).

The well contact region 116 is electrically connected to the source and drain of the PMOS transistor 1 via a wiring layer and acts as a control gate.

As shown in FIG. 12, in the memory cell 111, the substrate contact region 115 of the NMOS transistor 2 is arranged perpendicularly to the longitudinal direction of the floating gate 7, and the well contact region 116 of the PMOS transistor 1 is arranged in parallel with the longitudinal direction of the floating gate 7. In the cell array 110, the memory cell 111 and the memory cell 111A, which is axisymmetrically arranged with respect to the memory cell 111, are alternately arranged in the column direction (X) to constitute a sub array 111C, and the sub arrays arranged in the column direction (X) are arranged in parallel or axisymmetrically in the column direction (Y).

If the memory cells are arranged in parallel to constitute the cell array 110, the substrate contact region 115 has to be disposed in each of the memory cells in the column direction (X). In contrast, according to the present invention, the column having the memory cells 111 arranged axisymmetrically in the column direction (X) and the column having the memory cells 117 arranged axisymmetrically in the column direction (X) are arranged in the row direction (Y).

With this arrangement, the substrate contact region 115 can be shared between the adjacent memory cells. Further, since the source and drain of the PMOS transistor 1 are connected to a well potential and act as a control gate, the well contact region 116 can be shared between the adjacent memory cells in the row direction (Y).

Hence, it is possible to reduce the layout region in the row direction (Y) and the column direction (X), thereby reducing the area of the cell array.

While the substrate contact region 115 is disposed in each of the memory cells, the well contact region 116 is not disposed in each of the memory cells. It is recommendable to dispose the well contact region 116 in each of the optimum memory cells according to the size and purpose of the cell array 110.

In FIG. 12, the memory cells 111 and 111A are axisymmetrically arranged in the column direction (X) to constitute the sub array 111C and the sub arrays 111C arranged in the column direction (X) are arranged in parallel or axisymmetrically in the row direction (Y). The following arrangement is also applicable: the memory cells 111 and 111A are arranged in parallel with the column direction (X) to constitute a sub array and the sub arrays arranged in the column direction (X) are arranged in parallel or axisymmetrically in the row direction (Y).

Embodiment 5

Figure 3:
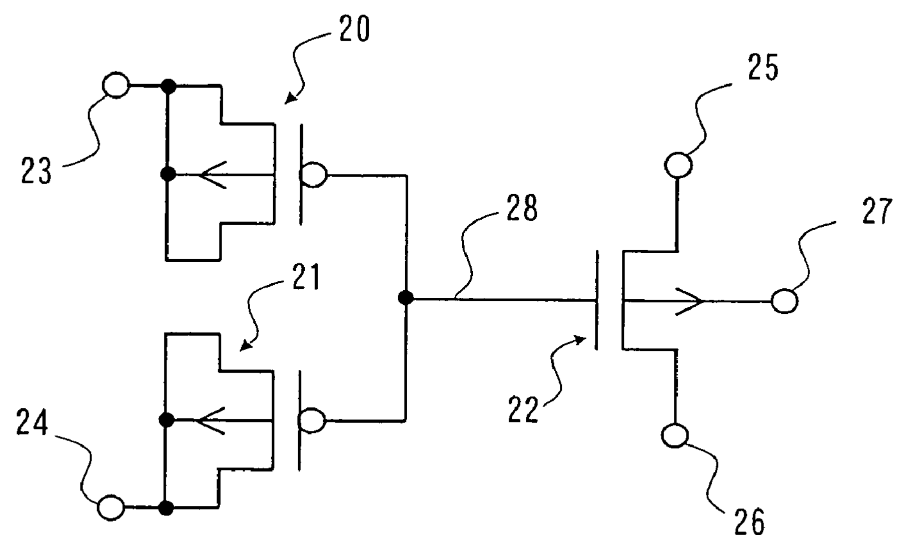
FIG. 3 is a circuit diagram showing a memory cell comprising a single NMOS transistor and two PMOS transistors.
Figure 4:
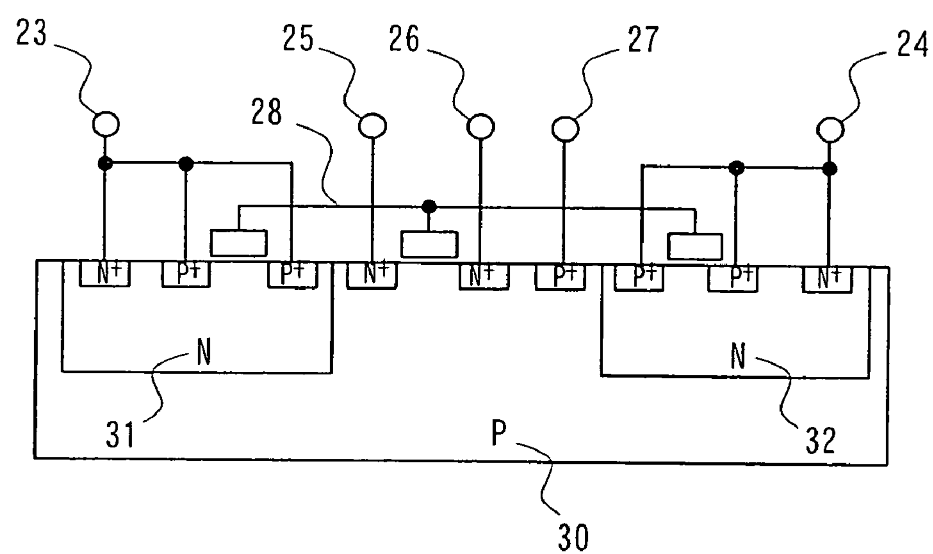
FIG. 4 is a process sectional view showing the memory cell of FIG. 3.

FIG. 3 is a circuit diagram showing a memory cell which comprises different control gates and comprises a single NMOS transistor and two PMOS transistors. FIG. 4 is a process sectional view showing the memory cell of FIG. 3.

In FIG. 3, reference numerals 20 and 21 denote PMOS transistors, reference numeral 22 denotes an NMOS transistor, reference numeral 23 denotes a first control gate, reference numeral 24 denotes a second control gate, reference numeral 25 denotes the drain of the NMOS transistor 22, reference numeral 26 denotes the source of the NMOS transistor 22, and reference numeral 27 denotes the substrate of the NMOS transistor 22. Reference numeral 28 denotes a floating gate for connecting the gates of the PMOS transistors 20 and 21 and the gate of the NMOS transistor 22.

As shown in FIG. 4, the NMOS transistor 22 serving as a MOS transistor of a second conductivity type is formed on a P-type semiconductor substrate 30 of a first conductivity type, and the NMOS transistor 22 has an N-type current-carrying region of a second conductivity type and a gate electrode. The PMOS transistors 20 and 21 serving as MOS transistors of a first conductivity type have wells 31 and 32 of a second conductivity type that are provided on the semiconductor substrate 30 and act as a control gate. Further, the PMOS transistors 20 and 21 each have a current-carrying region of a first conductivity type and a gate electrode that are provided on the wells 31 and 32.

Figure 13:
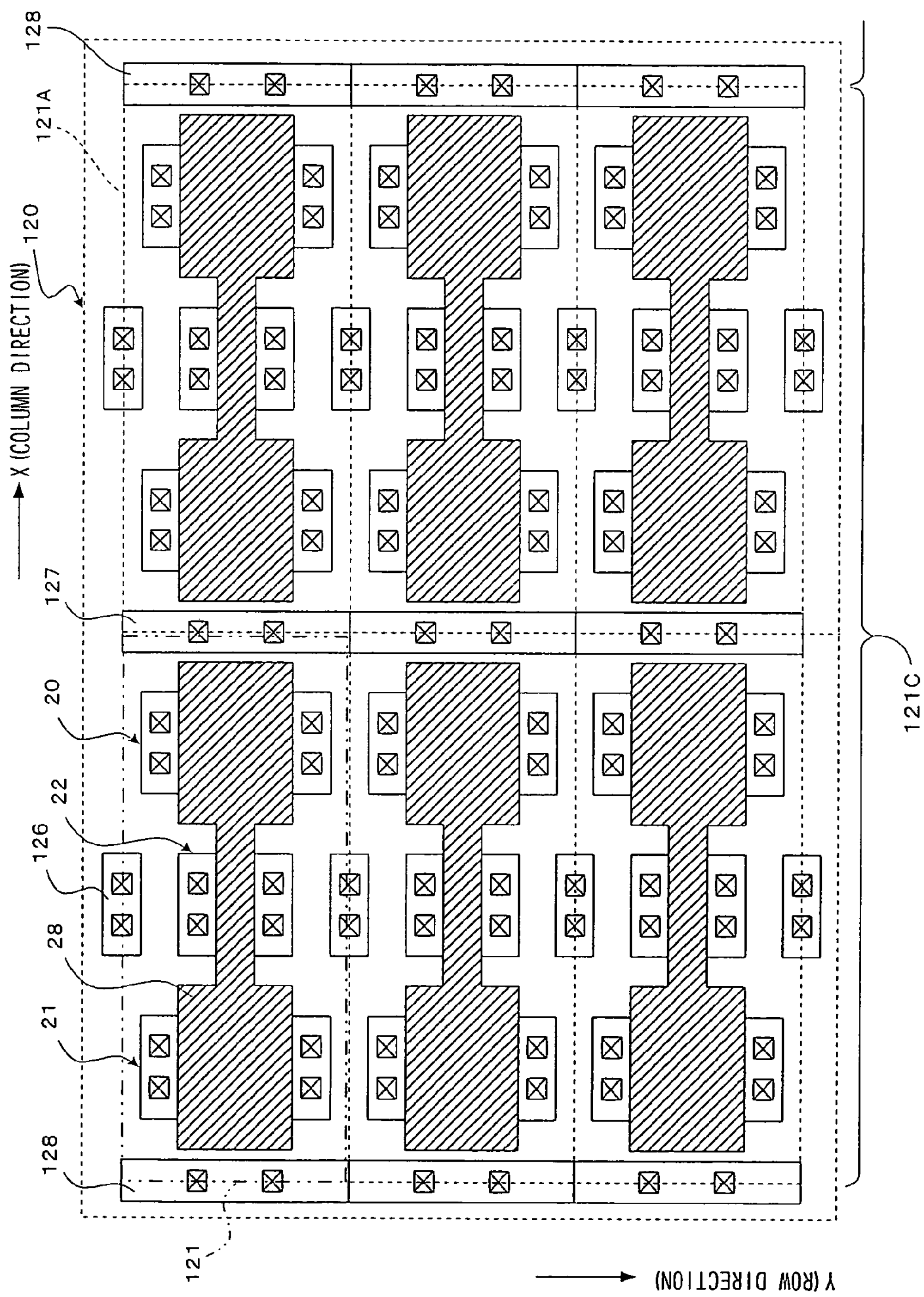
FIG. 13 is a cell array layout diagram showing (Embodiment 5) of the present invention.

As shown in FIG. 13, memory cells 121 are arranged in the row direction (Y) and column direction (X) to constitute a cell array 120. In the memory cell 121, the gate electrode of the NMOS transistor 22 and the gate electrodes of the PMOS transistors 20 and 21 are connected via the floating gate 28 and a predetermined voltage is applied to each terminal, so that a carrier can be written, read, and erased on the floating gate 28.

FIG. 13 shows (Embodiment 5) of the present invention according to the arrangement of the memory cell shown in FIG. 3.

Reference numeral 120 denotes a cell array, reference numeral 121 denotes a memory cell, and reference numeral 121A denotes a memory cell which is axisymmetrically arranged with respect to the memory cell 121. The memory cells 121 and 121A constitute a sub array 121C.

Reference numeral 126 denotes a substrate contact region for applying the substrate potential of the NMOS transistor 22, reference numeral 127 denotes a well contact region for applying the well potential of the PMOS transistor 20, and reference numeral 128 denotes a well contact region for applying the well potential of the PMOS transistor 21. The memory cell 121 comprises the NMOS transistor 22 and the PMOS transistors 20 and 21 that are adjacent to one another and are connected to the floating gate 28, and the cell array 120 comprises a number of memory cells 121 and 121A.

The well contact region 127 is electrically connected to the source and drain of the PMOS transistor 20 via a wiring layer and acts as a first control gate. The well contact region 128 is electrically connected to the source and drain of the PMOS transistor 21 via the wiring layer and acts as a second control gate.

As shown in FIG. 13, in the memory cell 121, the substrate contact region 126 of the NMOS transistor 22 is arranged in parallel with the longitudinal direction of the floating gate 28. The well contact regions 127 and 128 of the PMOS transistors 20 and 21 are arranged perpendicularly to the longitudinal direction of the floating gate 28. Regarding the PMOS transistors 20 and 21, the PMOS transistor 20 is disposed between the NMOS transistor 22 and the well contact region 127 and the PMOS transistor 21 is disposed between the NMOS transistor 22 and the well contact region 128, the NMOS transistor 22 being disposed at the center.

In the cell array 120, the memory cell 121 and the memory cell 121A, which is axisymmetrically arranged with respect to the memory cell 121, are alternately arranged in the column direction (X) to constitute a sub array 121C, and the sub arrays arranged in the column direction (X) are arranged in parallel or axisymmetrically in the row direction (Y).

If the memory cells 121 are arranged in parallel to constitute the cell array 120, it is necessary to secure well separation of the well contact regions 127 and 128 between the adjacent memory cells in the column direction (X). In the arrangement of the present invention, the well contact regions 127 and 128 can be shared between the adjacent memory cells, so that the layout region in the column direction (X) is reduced and thus the cell array has a smaller area.

Figure 14:
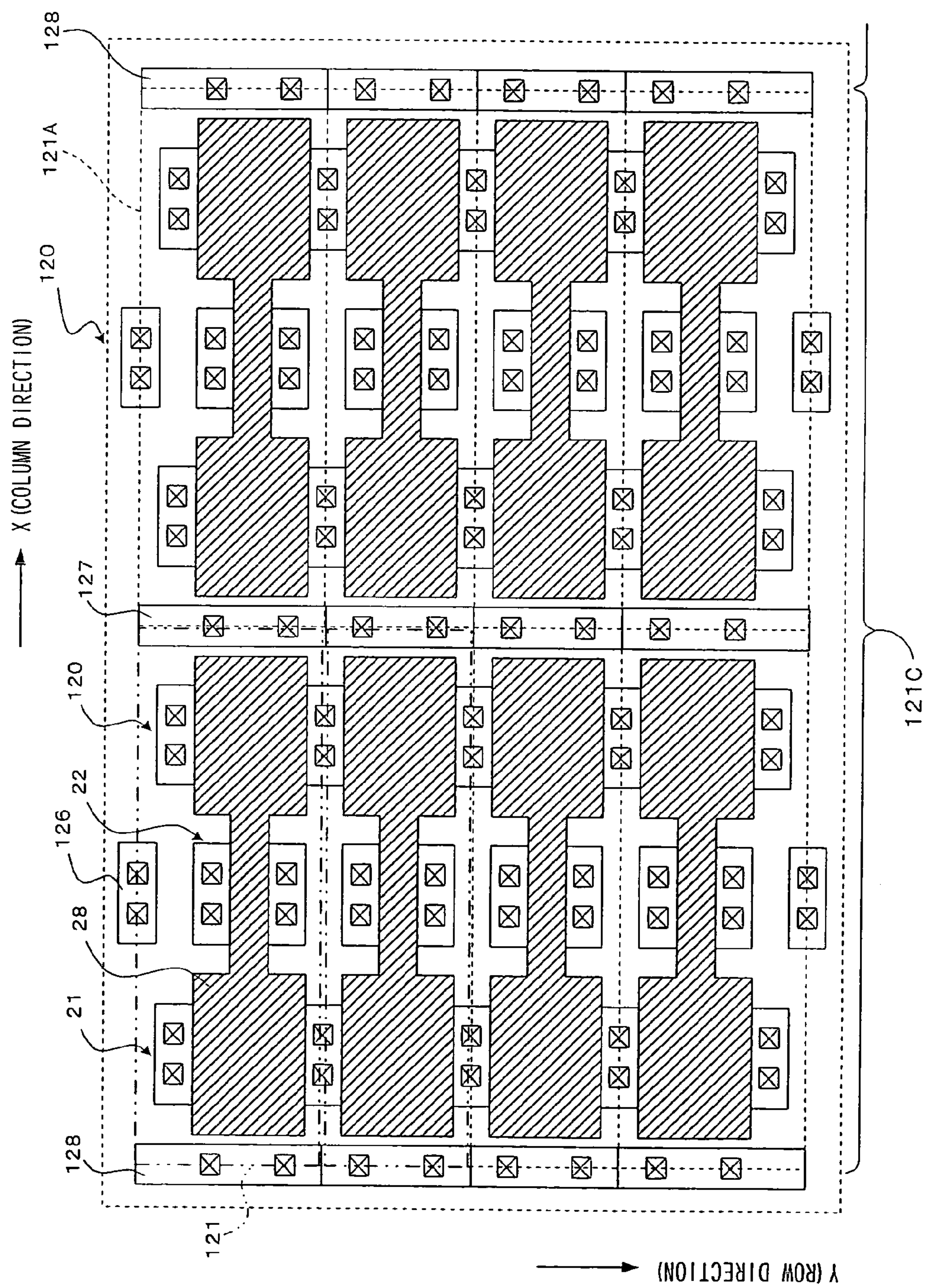
FIG. 14 is a cell array layout diagram showing a variation of (Embodiment 5) of the present invention.

FIG. 14 is a cell array layout drawing showing a variation of (Embodiment 5).

The source and drain of the PMOS transistors 20 and 21 are connected to a well potential and act as a control gate. Thus, as shown in FIG. 14, the source and drain of the PMOS transistor can be shared between the memory cells which are adjacent to each other in the row direction (Y). Hence, it is possible to reduce the layout region in the row direction (Y) in addition to the column direction (X), thereby further reducing the area of the cell array.

According to FIG. 14, the substrate contact region is disposed for the plurality of memory cells. It is recommendable to dispose a contact region in each of the optimum sub arrays 121C according to the size and purpose of the cell array.

Embodiment 6

Figure 15:
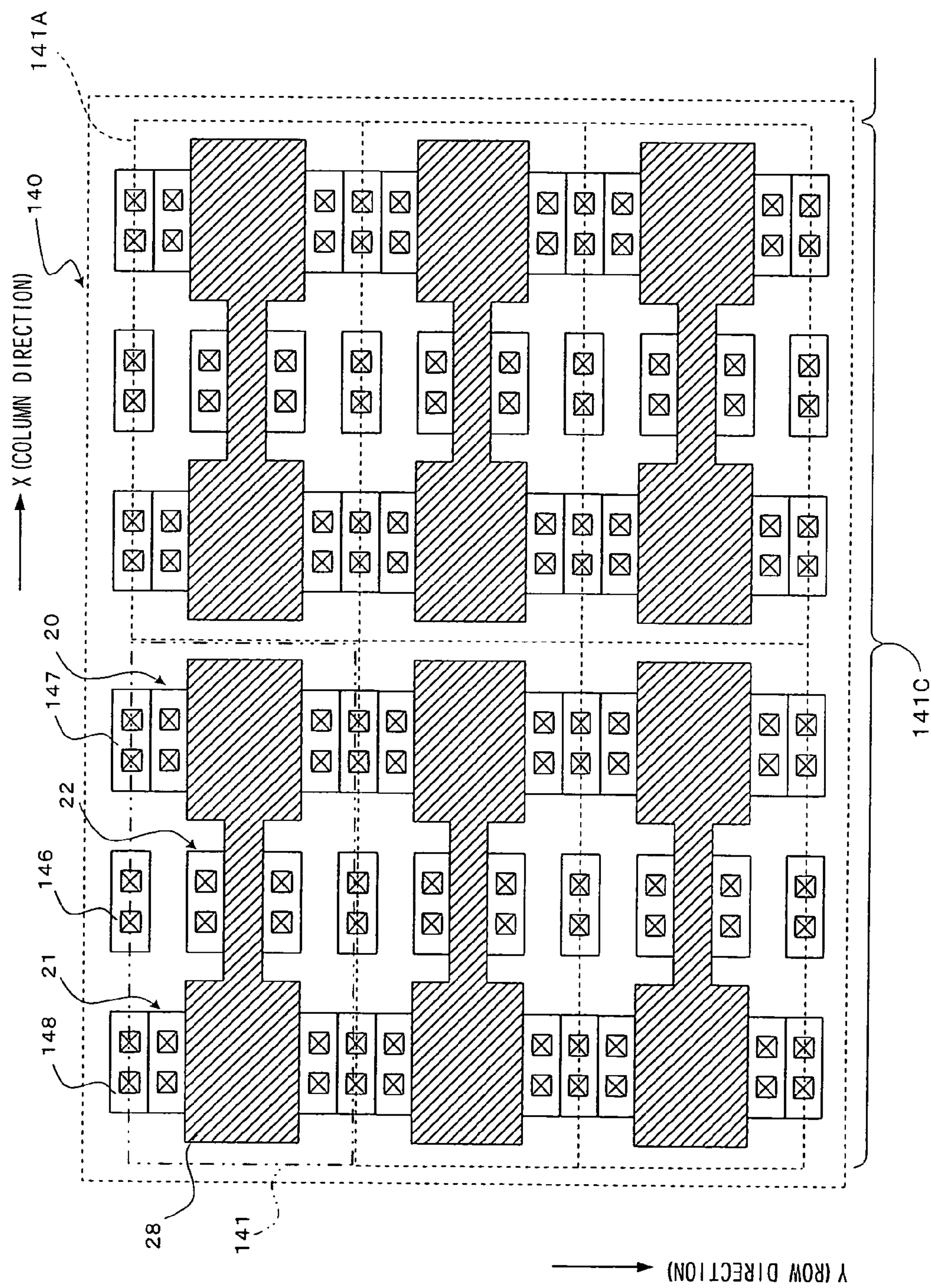
FIG. 15 is a cell array layout diagram showing (Embodiment 6) of the present invention.

FIG. 15 shows (Embodiment 6) of the present invention.

FIG. 15 shows a layout of the nonvolatile semiconductor memory device shown in FIGS. 3 and 4.

Reference numeral 140 denotes a cell array, reference numeral 141 denotes a memory cell, and reference numeral 141A denotes a memory cell which is axisymmetrically arranged with respect to the memory cell 141. The memory cells 141 and 141A constitute a sub array 141C.

Reference numeral 146 denotes a substrate contact region for applying the substrate potential of an NMOS transistor 22, reference numeral 147 denotes a well contact region for applying the well potential of a PMOS transistor 20, and reference numeral 148 denotes a well contact region for applying the well potential of a PMOS transistor 21. The memory cell 141 comprises the NMOS transistor 22 and the PMOS transistors 20 and 21 that are adjacent to one another and are connected to a floating gate 28, and the cell array 140 comprises a number of memory cells 141 and 141A.

The well contact region 147 is electrically connected to the source and drain of the PMOS transistor 20 via a wiring layer and acts as a first control gate, and the well contact region 148 is electrically connected to the source and drain of the PMOS transistor 21 via the wiring layer and acts as a second control gate.

As shown in FIG. 15, in the memory cell 141, the PMOS transistors 20 and 21 are disposed respectively on the sides of the NMOS transistor 22 which is disposed at the center. The substrate contact region 146 of the NMOS transistor 22 and the well contact regions 147 and 148 of the PMOS transistors 20 and 21 are arranged in parallel with the longitudinal direction of the floating gate 28.

In the cell array 140, a number of memory cells 141 and 141A, which are axisymmetrical to each other, are alternately arranged in the column direction (X) to constitute a sub array 141C, and the sub arrays 141C arranged in the column direction (X) are arranged in parallel or axisymmetrically in the row direction (Y).

With this arrangement, the substrate contact region 146 and the well contact regions 147 and 148 can be shared between the adjacent memory cells in the row direction (Y) and thus the layout region is reduced in the row direction (Y), thereby reducing the area of the cell array.

Figure 16:
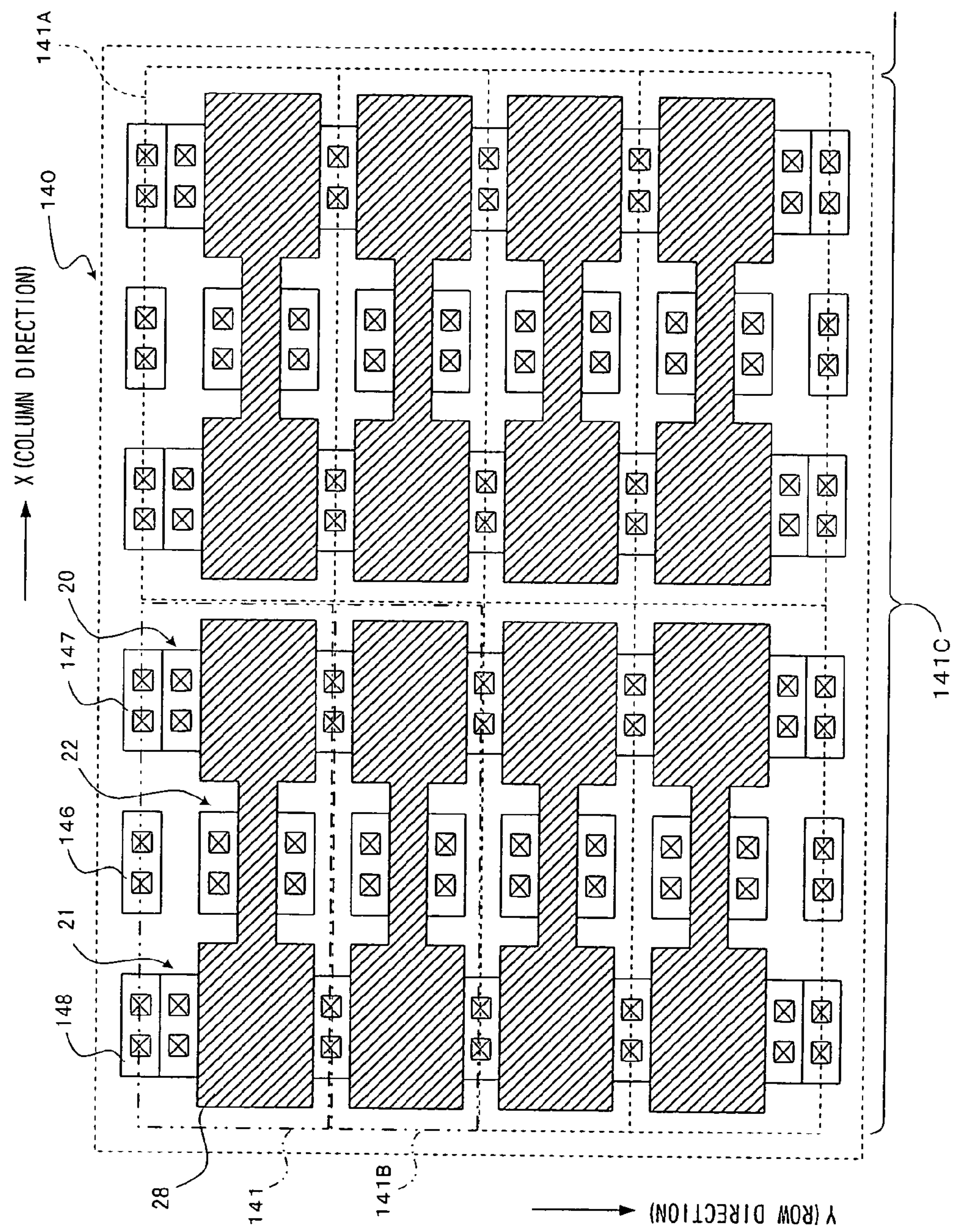
FIG. 16 is a cell array layout diagram showing a variation of (Embodiment 6) of the present invention.

FIG. 16 is a cell array layout drawing showing a variation of (Embodiment 6).

The source and drain of the PMOS transistors 20 and 21 are connected to a well potential and act as a control gate. As shown in FIG. 16, a memory cell 141B is provided which permits the source and drain of the PMOS transistor to be shared between the memory cells which are adjacent to each other in the row direction (Y). Therefore, the layout region can be further reduced in the row direction (Y) and thus the cell array has a smaller area.

To be specific, the cell array 140 of FIG. 16 comprises the memory cell 141, which has the substrate contact region 146 and the well contact regions 147 and 148, and a memory cell 141B not having a well contact region for applying a potential to the substrate of the first MOS transistor and the wells of the second MOS transistor and the third MOS transistor. The contact regions 146, 147, and 148 for applying a potential to the substrate of the first MOS transistor and the wells of the second MOS transistor and the third MOS transistor are arranged for the plurality of memory cells.

Unlike FIG. 15, the substrate and well contact regions are disposed for the plurality of memory cells in FIG. 16. It is recommendable to dispose a contact region in each of the optimum sub arrays according to the size and purpose of the cell array.

Figure 17:
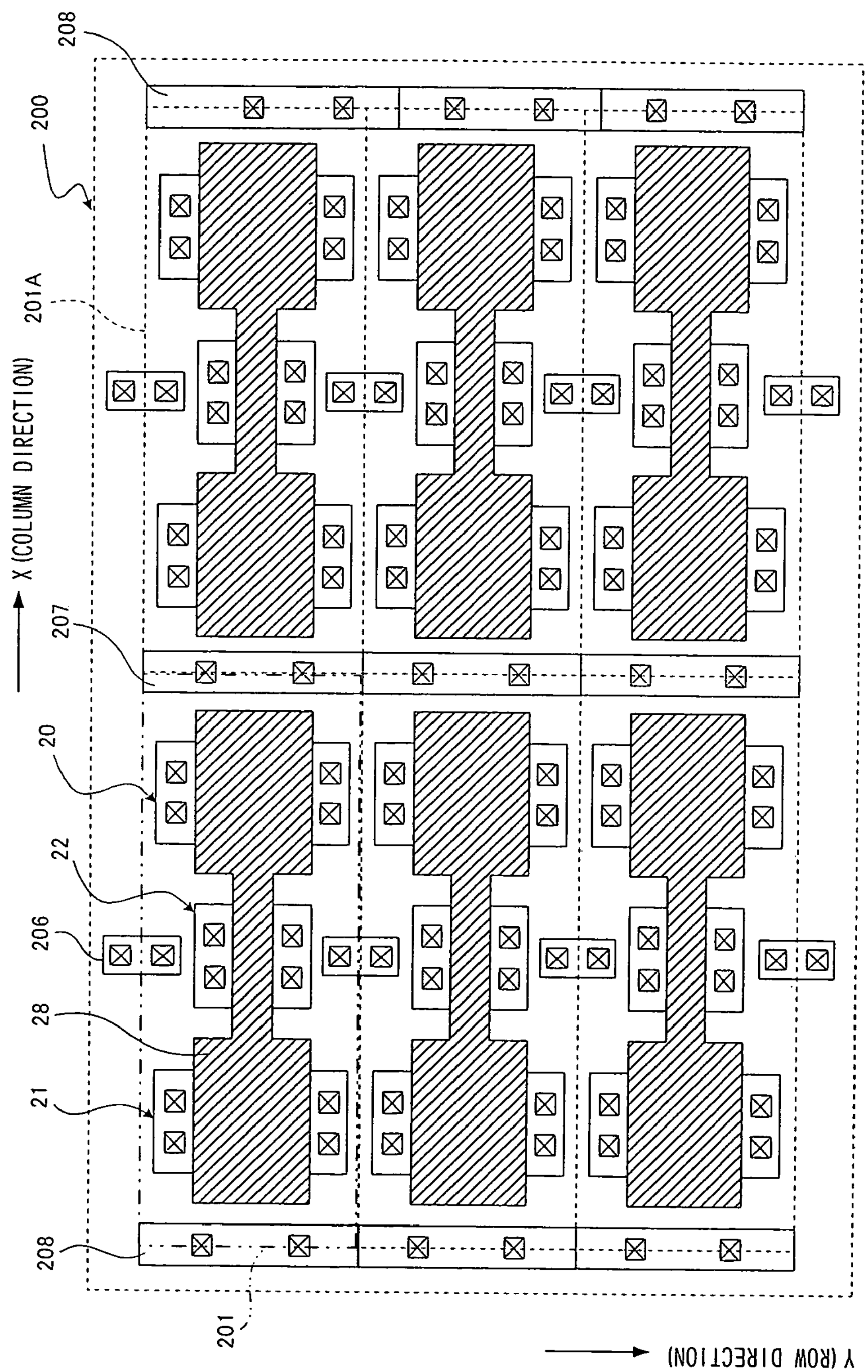
FIG. 17 is a cell array layout diagram showing a variation of FIG. 16.

As shown in FIG. 17, a cell array 200 comprises memory cells 201, in each of which a substrate contact region 206 of the NMOS transistor 22 and well contact regions 207 and 208 of the PMOS transistors 20 and 21 are arranged perpendicularly to the floating gate 28. In the cell array 200, a memory cell 201A which is axisymmetrically arranged with respect to the memory cell 201 is provided in the column direction (X) and the well contact regions 207 and 208 can be shared between the adjacent memory cells which are arranged in parallel or axisymmetrically in the row direction (Y), thereby reducing the layout region in the column direction.

Embodiment 7

Figure 18:
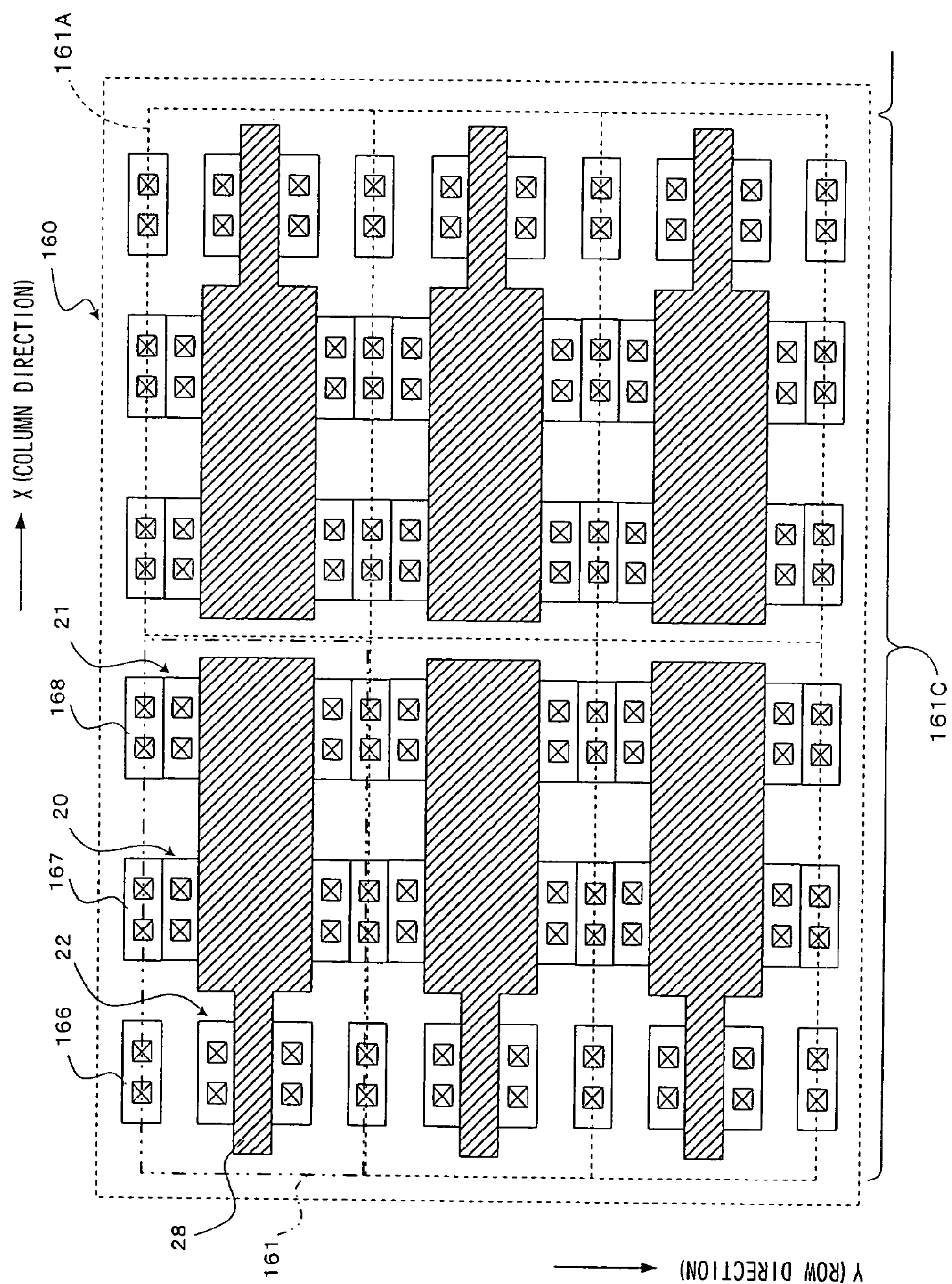
FIG. 18 is a cell array layout diagram showing (Embodiment 7) of the present invention.

FIG. 18 shows (Embodiment 7) of the present invention.

FIG. 18 shows another layout of the nonvolatile semiconductor memory device shown in FIG. 3.

In FIG. 18, reference numeral 160 denotes a cell array, reference numeral 161 denotes a memory cell, and reference numeral 161A denotes a memory cell which is axisymmetrically arranged with respect to the memory cell 161. The memory cells 161 and 161A constitute a sub array 161C.

Reference numeral 166 denotes a substrate contact region for applying the substrate potential of an NMOS transistor 22, reference numeral 167 denotes a well contact region for applying the well potential of a PMOS transistor 20, and reference numeral 168 denotes a well contact region for applying the well potential of a PMOS transistor 21. The memory cell 161 comprises the NMOS transistor 22 and the PMOS transistors 20 and 21 that are adjacent to one another and are connected to a floating gate 28, and the cell array 160 comprises the memory cells 161. The well contact region 167 is electrically connected to the source and drain of the PMOS transistor 20 via a wiring layer and acts as a first control gate, and the well contact region 168 is electrically connected to the source and drain of the PMOS transistor 21 via the wiring layer and acts as a second control gate.

As shown in FIG. 18, in the memory cell 161, the PMOS transistor 20 is adjacent to the NMOS transistor 22, the PMOS transistor 21 is adjacent to the PMOS transistor 20, and a substrate contact region 166 of the NMOS transistor 22 and well contact regions 166 and 167 of the PMOS transistors 20 and 21 are arranged in parallel with the longitudinal direction of a floating gate 28.

In the cell array 160, a number of memory cells 161 and 161A, which are axisymmetrical to each other, are alternately arranged in the column direction (X) to constitute the sub array 161C, and the sub arrays are arranged in parallel or axisymmetrically in the column direction (Y).

When the memory cells 161 are arranged in parallel to constitute a cell array, it is necessary to secure separation of the substrate contact region and the well contact region between the memory cells which are adjacent to each other in the row direction (Y). According to the arrangement of the present invention, the substrate contact region 166 and the well contact regions 166 and 167 can be shared between the adjacent memory cells. Therefore, the layout region can be reduced in the row direction (Y) and thus the cell array has a smaller area.

Figure 19:
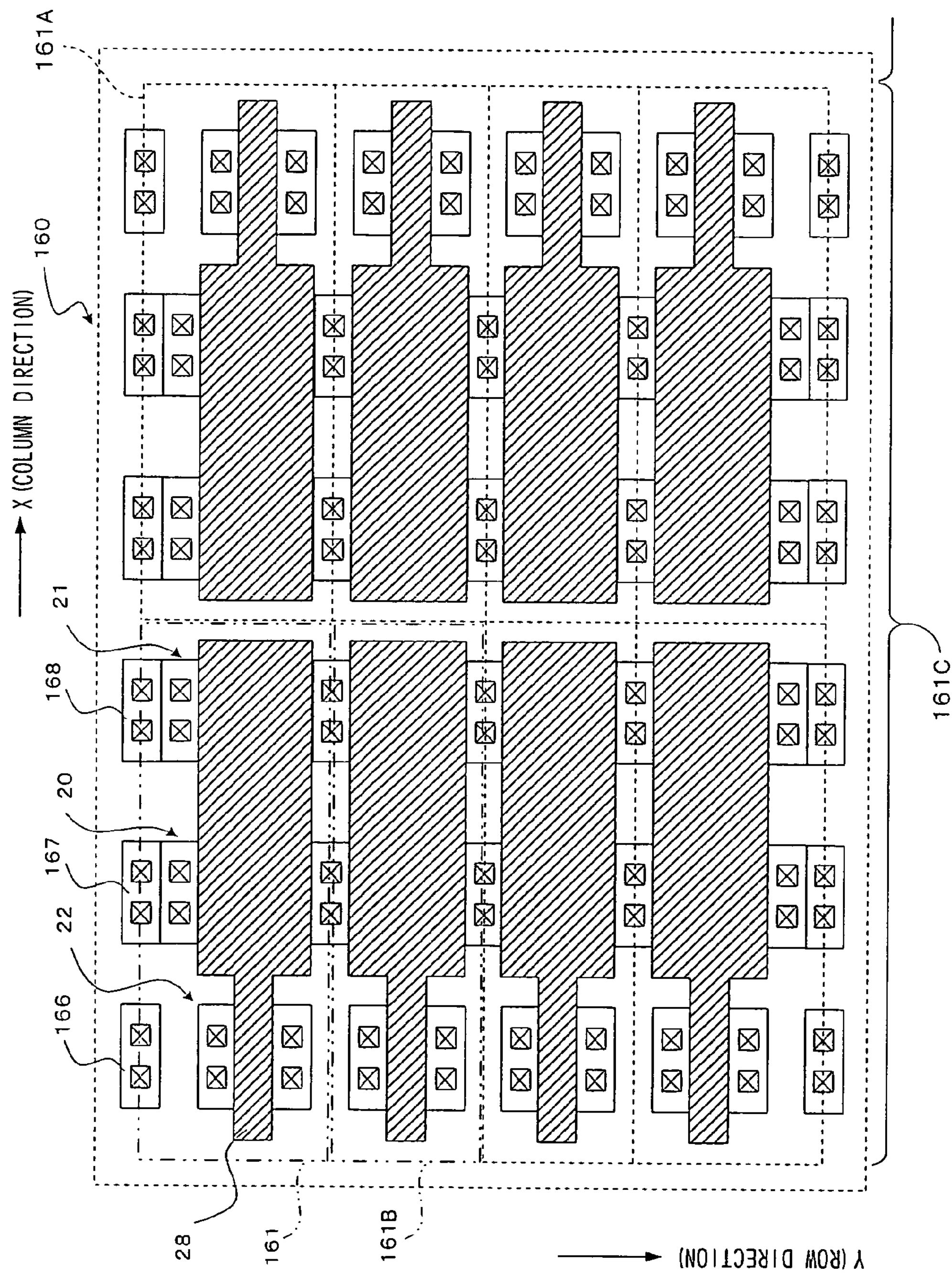
FIG. 19 is a cell array layout diagram showing a variation of (Embodiment 7) of the present invention.

FIG. 19 is a cell array layout drawing showing a variation of (Embodiment 7).

The sources and drains of the PMOS transistors 20 and 21 are connected to a well potential and act as a control gate. Thus, as shown in FIG. 19, the sources and drains can be shared by providing a memory cell 161B permitting the sources and drains of the PMOS transistors to be shared between the memory cells which are adjacent to each other in the row direction (Y). With this arrangement, it is possible to further reduce the layout region in the row direction (Y) and thus the cell array has a smaller area.

According to the variation of FIG. 19, the substrate and well contact regions are disposed for the plurality of memory cells. It is recommendable to dispose a contact region in each of the optimum sub arrays according to the size of the cell array and a used application.

Embodiment 8

Figure 20:
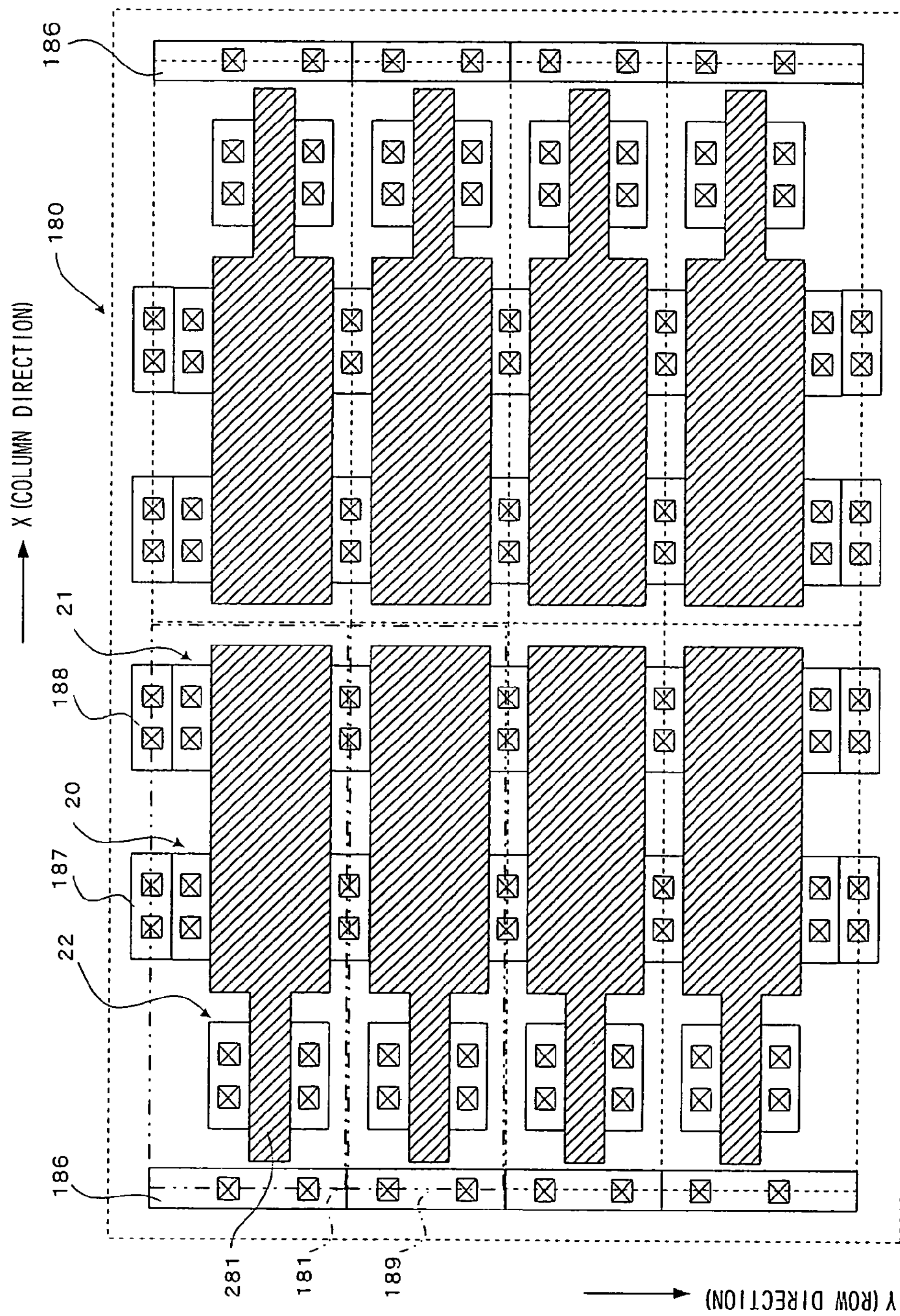
FIG. 20 is a cell array layout diagram showing (Embodiment 8) of the present invention.

FIG. 20 shows (Embodiment 8) of the present invention.

FIG. 20 shows another layout of the nonvolatile semiconductor memory device shown in FIG. 3.

Reference numeral 180 denotes a cell array and reference numerals 181 and 189 denote memory cells. Reference numeral 186 denotes a substrate contact region for applying the substrate potential of an NMOS transistor 22, reference numeral 187 denotes a well contact region for applying the well potential of a PMOS transistor 20, and reference numeral 188 denotes a well contact region for applying the well potential of a PMOS transistor 21.

The memory cells 181 and 189 each comprise of the NMOS transistor 22 and the PMOS transistors 20 and 21 that are adjacent to one another and are connected to a floating gate 28. The well contact region 187 is electrically connected to the source and drain of the PMOS transistor 20 via a wiring layer and acts as a first control gate, and the well contact region 188 is electrically connected to the source and drain of the PMOS transistor 21 via the wiring layer and acts as a second control gate.

The memory cell 181 has the substrate contact region 186 and the well contact regions 187 and 188. The memory cell 189 has the substrate contact region 186 but does not have the well contact regions 187 and 188.

As shown in FIG. 20, in the memory cells 181 and 189, the PMOS transistor 20 is adjacent to the NMOS transistor 22 and the PMOS transistor 21 is adjacent to the PMOS transistor 20.

The substrate contact region 186 of the NMOS transistor 22 is arranged perpendicularly to the longitudinal direction of the floating gate 28, and the well contact regions 187 and 188 of the PMOS transistors 20 and 21 are arranged in parallel with the longitudinal direction of the floating gate 28.

In the cell array 180, a number of memory cells 181 and 189, which are axisymmetrical to each other, are alternately arranged in the column direction (X) to constitute a sub array, and the sub arrays are arranged in parallel or axisymmetrically in the row direction (Y).

When the memory cells 181 are arranged in parallel to constitute the cell array 180, the substrate contact region has to be disposed in each of the memory cells in the column direction (X). With the arrangement of the present invention, the substrate contact regions 186 can be shared between the adjacent memory cells in the column direction (X), thereby reducing the layout region.

Further, the sources and drains of the PMOS transistors 20 and 21 are connected to a well potential and act as a control gate. Thus, the source and drain of the PMOS transistor can be shared between the memory cells which are adjacent to each other in the row direction (Y). Hence, it is possible to reduce the layout region in the row direction (Y) in addition to the column direction (X), thereby reducing the area of the cell array.

According to the present embodiment, while the substrate contact region is disposed in each of the memory cells, the well contact region is disposed for a plurality of memory cells. It is recommendable to dispose a contact region in each of the optimum sub arrays according to the size and purpose of the cell array.

Embodiment 9

Figure 21:
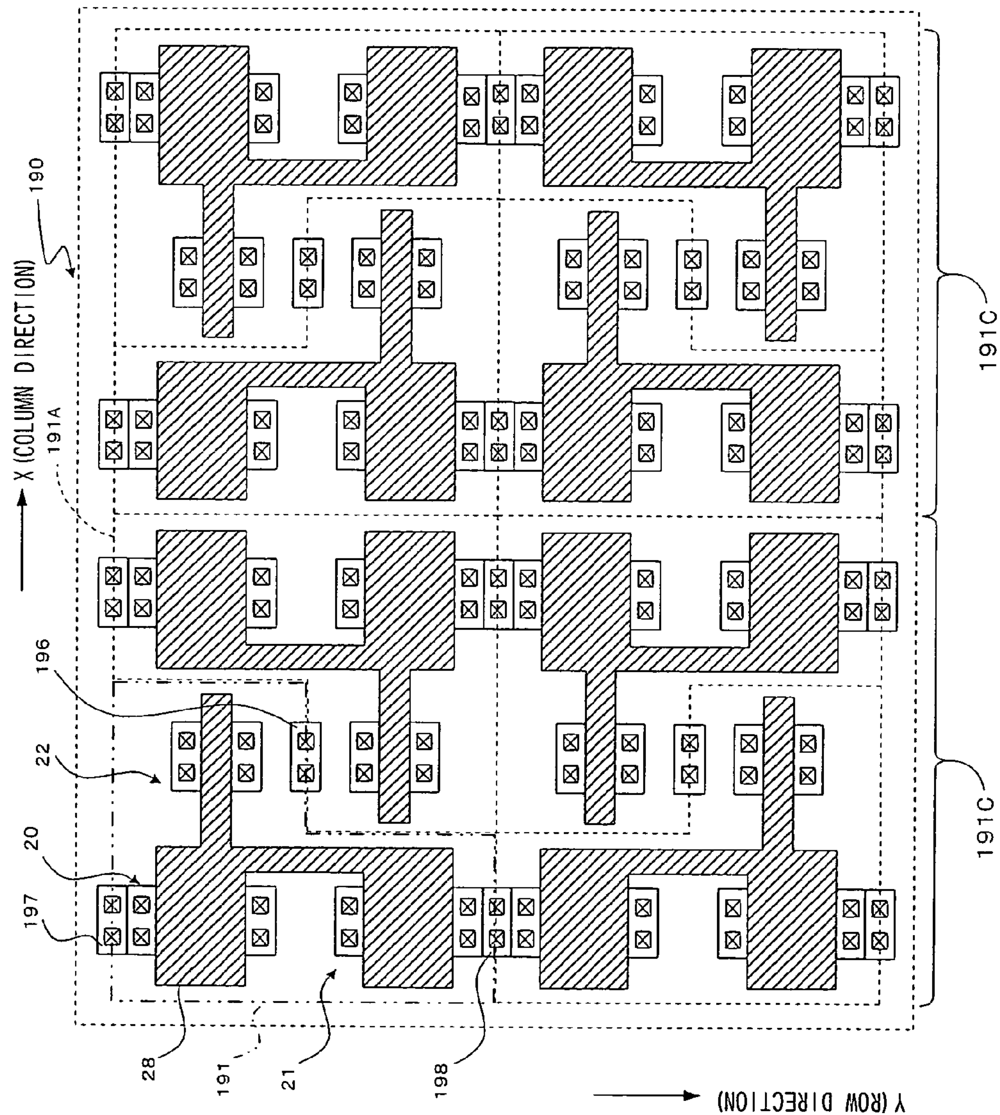
FIG. 21 is a cell array layout diagram showing (Embodiment 9) of the present invention.

FIG. 21 shows (Embodiment 9) of the present invention.

FIG. 21 shows another layout of the nonvolatile semiconductor memory device shown in FIG. 3.

Reference numeral 190 denotes a cell array and reference numerals 191 and 191A denote memory cells. Reference numeral 196 denotes a substrate contact region for applying the substrate potential of an NMOS transistor 22, reference numeral 197 denotes a well contact region for applying the well potential of a PMOS transistor 20, and reference numeral 198 denotes a well contact region for applying the well potential of a PMOS transistor 21.

The memory cells 191 comprises the NMOS transistor 22 and the PMOS transistors 20 and 21 that are adjacent to one another and are connected to a floating gate 28. The plurality of memory cells 191 are arranged to constitute the cell array 190.

The well contact region 197 is electrically connected to the source and drain of the PMOS transistor 20 via a wiring layer and acts as a first control gate, and the well contact region 198 is electrically connected to the source and drain of the PMOS transistor 21 via the wiring layer and acts as a second control gate.

In the memory cell 191, the PMOS transistor 20 and the PMOS transistor 21 are arranged in the row direction (Y), and the NMOS transistor 22 is adjacent to the PMOS transistor 20.

The substrate contact region 196 of the NMOS transistor 22 and the well contact regions 197 and 198 of the PMOS transistors 20 and 21 are arranged in parallel with the direction of the floating gate 28 (column direction (X)) which connects the NMOS transistor 22 and the PMOS transistor 20.

In the cell array 190, a sub array 191C comprises the memory cell 191 and a memory cell 191A which is arranged point symmetrically with respect to the memory cell 191. The memory cell 191 and the memory cell 191A are alternately arranged in the column direction (X). The sub arrays are arranged axisymmetrically in the row direction (Y).

With this arrangement, the substrate contact region 196 and the well contact regions 197 and 198 can be shared between the adjacent memory cells in the row direction (Y), thereby reducing the area of the cell array. The substrate contact region 196 and the well contact regions 197 and 198 are connected via the same wiring layer in the column direction (X), achieving a layout of high efficiency.

The PMOS transistor 20 and the PMOS transistor 21 are arranged in the row direction (Y) and the NMOS transistor 22 is adjacent to the PMOS transistor 20. The PMOS transistor 20 and the PMOS transistor 21 may be arranged in the column direction (X) and the NMOS transistor 22 may be adjacent to the PMOS transistor 20 or the PMOS transistor 21. The PMOS transistor 20 and the PMOS transistor 21 are arranged in one of the column direction (X) and the row direction, the NMOS transistor 22 is adjacent to one of the PMOS transistor 20 and the PMOS transistor 21 in the other of the column direction (X) and the row direction (Y), the gate electrode of the PMOS transistor 20 and the gate electrode of the PMOS transistor 21 are connected to each other via the floating gate 28, the floating gate 28 is extended and connected to the gate electrode of the NMOS transistor 22 from the vicinity of the one of the PMOS transistor 20 and the PMOS transistor 21, and the substrate contact region 186 for applying a potential to the substrate of the NMOS transistor 22 is arranged so as to be adjacent to the NMOS transistor 22 on the other of the PMOS transistor 20 and the PMOS transistor 21.

As described above, according to the nonvolatile semiconductor memory device of the present invention, the contact regions for applying the substrate potential and well potential of the MOS transistors are arranged optimally according to the size of the cell array and a used application to share overlapping nodes, thereby reducing the area of the cell array.

What is claimed is:

1. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, each of the memory cells being capable of writing, reading, and erasing a carrier on the floating gate by applying a predetermined voltage to each terminal of the first MOS transistor and the second MOS transistor, wherein the cell array has a substrate contact region and a well contact region each arranged perpendicularly to a longitudinal direction of the floating gate, the substrate contact region and the well contact region being provided for applying potentials to the semiconductor substrate and the well of the second MOS transistor.

2. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, each of the memory cells being capable of writing, reading, and erasing a carrier on the floating gate by applying a predetermined voltage to each terminal of the first MOS transistor and the second MOS transistor, wherein the cell array has a substrate contact region and a well contact region each arranged in parallel with a longitudinal direction of the floating gate, the substrate contact region and the well contact region being provided for applying potentials to the substrate of the first MOS transistor and the well of the second MOS transistor.

3. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, each of the memory cells being capable of writing, reading, and erasing a carrier on the floating gate by applying a predetermined voltage to each terminal of the first MOS transistor and the second MOS transistor, wherein the cell array has a substrate contact region, which applies a potential to the substrate of the first MOS transistor, in parallel with a longitudinal direction of the floating gate, and the cell array has a well contact region, which applies a potential to the well of the second MOS transistor, perpendicularly to the longitudinal direction of the floating gate.

4. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a well of the second conductivity type serving as a control gate on the semiconductor substrate and has a current-carrying region of the first conductivity type and a gate electrode on the well, and a floating gate which is connected to the gate electrode of the first MOS transistor and the gate electrode of the second MOS transistor in a shared manner, each of the memory cells being capable of writing, reading, and erasing a carrier on the floating gate by applying a predetermined voltage to each terminal of the first MOS transistor and the second MOS transistor, wherein the cell array has a substrate contact region, which applies a potential to the substrate of the first MOS transistor, perpendicularly to a longitudinal direction of the floating gate, and the cell array has a well contact region, which applies a potential to the well of the second MOS transistor, in parallel with the longitudinal direction of the floating gate.

5. The nonvolatile semiconductor memory device according to any one of claim 1, wherein in the cell array, the memory cells are arranged in parallel or axisymmetrically in the column direction to constitute a sub array and the sub arrays arranged in the column direction are arranged in parallel or axisymmetrically in the row direction.

6. The nonvolatile semiconductor memory device according to any one of claim 1, wherein in the cell array, the memory cell and another memory cell arranged axisymmetrically with respect to the memory cell constitute a sub array in the column direction and the sub arrays arranged in the column direction are arranged in parallel or axisymmetrically in the row direction.

7. The nonvolatile semiconductor memory device according to claim 5, wherein on a boundary of the memory cell and the sub array, overlapping contact regions and/or diffusion regions are shared between the adjacent memory cells and sub arrays.

8. The nonvolatile semiconductor memory device according to claim 6, wherein on a boundary of the memory cell and the sub array, overlapping contact regions and/or diffusion regions are shared between the adjacent memory cells and sub arrays.

9. The nonvolatile semiconductor memory device according to claim 7, wherein the cell array comprises:

a memory cell which has the substrate contact region for applying a potential to the substrate of the first MOS transistor and the well contact region for applying a potential to the well of the second MOS transistor, and a memory cell which does not have the substrate contact region for applying a potential to the substrate of the first MOS transistor or the well contact region for applying a potential to the well of the second MOS transistor, and the substrate contact region and the well contact region are disposed for a plurality of memory cells.

10. The nonvolatile semiconductor memory device according to claim 7, wherein the cell array comprises:

a memory cell which has the substrate contact region for applying a potential to the substrate of the first MOS transistor and the well contact region for applying a potential to the well of the second MOS transistor, and a memory cell which has the substrate contact region for applying a potential to the substrate of the first MOS transistor but does not have the well contact region for applying a potential to the well of the second MOS transistor, and the well contact region for applying a potential to the well of the second MOS transistor is disposed for a plurality of memory cells.

11. The nonvolatile semiconductor memory device according to claim 7, wherein the cell array comprises:

a memory cell which has the substrate contact region for applying a potential to the substrate of the first MOS transistor and the well contact region for applying a potential to the well of the second MOS transistor, and a memory cell which has the well contact region for applying a potential to the well of the second MOS transistor but does not have the substrate contact region for applying a potential to the substrate of the first MOS transistor, and the substrate contact region for applying a potential to the substrate of the first MOS transistor is disposed for a plurality of memory cells.

12. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, each of the memory cells being capable of writing, reading, and erasing a carrier on the floating gate by applying a predetermined voltage to each terminal of the first, second and third MOS transistors, wherein the cell array has a substrate contact region, which applies a potential to the substrate of the first MOS transistor, in parallel with a longitudinal direction of the floating gate, and the cell array has contact regions, which apply a potential to the wells of the second and third MOS transistors, perpendicularly to the longitudinal direction of the floating gate.

13. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, each of the memory cells being capable of writing, reading, and erasing a carrier on the floating gate by applying a predetermined voltage to each terminal of the first, second and third MOS transistors, wherein the cell array has a substrate contact region, which applies a potential to the substrate of the first MOS transistor, and well contact regions, which apply a potential to the wells of the second and third MOS transistors, in parallel with a longitudinal direction of the floating gate.

14. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, each of the memory cells being capable of writing, reading, and erasing a carrier on the floating gate by applying a predetermined voltage to each terminal of the first, second and third MOS transistors, wherein the cell array has a substrate contact region, which applies a potential to the substrate of the first MOS transistor, and well contact regions, which apply a potential to the wells of the second and third MOS transistors, perpendicularly to a longitudinal direction of the floating gate.

15. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, each of the memory cells being capable of writing, reading, and erasing a carrier on the floating gate by applying a predetermined voltage to each terminal of the first, second and third MOS transistors, wherein the cell array has a substrate contact region, which applies a potential to the substrate of the first MOS transistor, perpendicularly to a longitudinal direction of the floating gate, and the cell array has well contact regions, which apply a potential to the wells of the second and third MOS transistors, in parallel with the longitudinal direction of the floating gate.

16. The nonvolatile semiconductor memory device according to claim 12, wherein in an arrangement of the MOS transistors constituting the memory cell, the second MOS transistor and the third transistor are disposed respectively on sides of the first MOS transistor which is disposed at a center of the arrangement.

17. The nonvolatile semiconductor memory device according to claim 13, wherein in the arrangement of the MOS transistors constituting the memory cell, the second MOS transistor is adjacent to the first MOS transistor and the third MOS transistor is adjacent to the second MOS transistor.

18. The nonvolatile semiconductor memory device according to claim 16, wherein in the cell array, the memory cells are arranged in parallel with the column direction to constitute a sub array, and the sub arrays arranged in the column direction are arranged in parallel or axisymmetrically in the row direction.

19. The nonvolatile semiconductor memory device according to claim 17, wherein in the cell array, the memory cells are arranged in parallel with the column direction to constitute a sub array, and the sub arrays arranged in the column direction are arranged in parallel or axisymmetrically in the row direction.

20. The nonvolatile semiconductor memory device according to claim 16, wherein in the cell array, the memory cell and another memory cell which is arranged point symmetrically with respect to the memory cell constitute a sub array in the column direction, and the sub arrays arranged in the column direction are arranged in parallel or axisymmetrically in the row direction.

21. The nonvolatile semiconductor memory device according to claim 17, wherein in the cell array, the memory cell and another memory cell which is arranged point symmetrically with respect to the memory cell constitute a sub array in the column direction, and the sub arrays arranged in the column direction are arranged in parallel or axisymmetrically in the row direction.

22. The nonvolatile semiconductor memory device according to any one of claim 12, wherein on a boundary of the memory cells, overlapping contact regions and diffusion regions are shared between adjacent memory cells.

23. The nonvolatile semiconductor memory device according to claim 22, wherein the cell array comprises:

a memory cell which has the substrate contact region for applying a potential to the substrate of the first MOS transistor and the well contact regions for applying a potential to the wells of the second and third MOS transistors, and a memory cell which does not have the substrate contact region for applying a potential to the substrate of the first MOS transistor or the well contact regions for applying a potential to the wells of the second and third MOS transistors, and the contact regions for applying a potential to the substrate of the first MOS transistor and the wells of the second and third MOS transistors are disposed for a plurality of memory cells.

24. The nonvolatile semiconductor memory device according to claim 22, wherein the cell array comprises a memory cell which has the substrate contact region for applying a potential to the substrate of the first MOS transistor and the well contact regions for applying a potential to the wells of the second and third MOS transistors, and a memory cell which has the substrate contact region for applying a potential to the substrate of the first MOS transistor but does not have the well contact regions for applying a potential to the wells of the second and third MOS transistors, and the well contact regions for applying a potential to the wells of the second and third MOS transistors are disposed for a plurality of memory cells.

25. A nonvolatile semiconductor memory device comprising:

a cell array in which memory cells are arranged in a row direction and a column direction, each of the memory cells comprising a first MOS transistor which is formed on a semiconductor substrate of a first conductivity type and has a current-carrying region of a second conductivity type and a gate electrode, a second MOS transistor which has a first well of the second conductivity type serving as a first control gate on the semiconductor substrate and has a current-carrying region of the first conductivity type and a gate electrode on the first well, a third MOS transistor which has a second well of the second conductivity type serving as a second control gate on the semiconductor substrate and has a current-carrying region of the first conductivity type and a gate electrode on the second well, and a floating gate which is connected to the gate electrode of the first MOS transistor and the gate electrodes of the second and third MOS transistors in a shared manner, each of the memory cells being capable of writing, reading, and erasing a carrier on the floating gate by applying a predetermined voltage to each terminal of the first, second and third MOS transistors, wherein in the cell array, the second MOS transistor and the third MOS transistor are arranged in one of the column direction and the row direction, the first NMOS transistor is adjacent to one of the second MOS transistor and the third MOS transistor in the other of the column direction and the row direction, the gate electrode of the second MOS transistor and the gate electrode of the third MOS transistor are connected to each other via the floating gate, the floating gate is extended and connected to the gate electrode of the first MOS transistor from a vicinity of the one of the second MOS transistor and the third MOS transistor, and the contact region for applying a potential to the substrate of the first MOS transistor is arranged so as to be adjacent to the first MOS transistor on the other of the second MOS transistor and the third MOS transistor.

* * * * *